United States Patent [19]
McClintock et al.

[11] Patent Number: 6,091,258
[45] Date of Patent: Jul. 18, 2000

[54] REDUNDANCY CIRCUITRY FOR LOGIC CIRCUITS

[75] Inventors: Cameron McClintock, Mountain View; Andy L. Lee, San Jose; Richard G. Cliff, Milpitas, all of Calif.

[73] Assignee: Altera Corporation, San Jose, Calif.

[21] Appl. No.: 09/433,544

[22] Filed: Nov. 3, 1999

Related U.S. Application Data

[63] Continuation of application No. 08/982,297, Dec. 1, 1997.
[60] Provisional application No. 60/037,816, Feb. 5, 1997, and provisional application No. 60/042,004, Apr. 16, 1997.

[51] Int. Cl.$^7$ ..................... H03K 19/003; H03K 19/173; H03K 19/177
[52] U.S. Cl. .................. 326/10; 326/38; 326/41
[58] Field of Search ................. 326/10, 13, 37, 326/38, 39, 41, 44, 47

[56] References Cited

U.S. PATENT DOCUMENTS

| Re. 33,521 | 1/1991 | Mori et al. ........................ 364/200 |
| 3,566,153 | 2/1971 | Spencer, Jr. et al. ................ 307/205 |

(List continued on next page.)

FOREIGN PATENT DOCUMENTS

| 351983 A3 | 1/1990 | European Pat. Off. ........ G06F 11/20 |
| 361404 A3 | 4/1990 | European Pat. Off. ........ G06F 11/20 |
| 437081 A2 | 7/1991 | European Pat. Off. ........ G06F 11/20 |
| 596453 A2 | 5/1994 | European Pat. Off. ........ G06F 11/20 |

OTHER PUBLICATIONS

"A Survey of Microcellular Research", R.C. Minnick, Journal of the Association of Computing Machinery, vol. 14, No. 2, pp. 203–41, Apr. 1967.

"Programmable Logic Arrays—Cheaper by the Millions," S.E. Wahlstrom, Electronics, Dec. 1967, pp. 90–95.

"Recent Developments in Switching Theory", A. Mukhopadhyay, ed., Academic Press, New York, 1971, chapters VI and IX, pp. 229–254 and 369–422.

"Memories and Redundancy Techniques", K. Kokkonen et al., Digest of Technical Papers, IEEE International Solid–State Circuits Conference, pp. 80–1, Feb., 1981.

"Cost–Effective Yield Improvement in Fault–Tolerant VLSI Memory", J. Binders et al., Digest of Technical Papers, IEEE International Solid–State Circuits Conference, pp. 82–3, Feb., 1981.

"A 100ns 64K Dynamic RAM using Redundancy Techniques", S. Eaton et al., Digest of Technical Papers, IEEE International Solid–State Circuits Conference, pp. 84–5, Feb., 1981.

"Introducing Redundancy In Field Programmable Gate Arrays", F. Hatori et al., Proceedings of the IEEE 1993 Custom Integrated Circuits Conference, pp. 7.1.1—7.1.4, May 1993.

(List continued on next page.)

*Primary Examiner*—Michael Tokar
*Assistant Examiner*—James A. Cho
*Attorney, Agent, or Firm*—Fish & Neave; Robert R. Jackson; G. Victor Treyz

[57] ABSTRACT

Redundant circuitry for a logic circuit such as a programmable logic device is provided. The redundant circuitry allows the logic circuit to be repaired by replacing a defective logic area on the circuit with a redundant logic circuit. Rows and columns of logic areas may be logically remapped by row and column swapping. The logic circuit contains dynamic control circuitry for directing programming data to various logic areas on the circuit in an order defined by redundancy configuration data. Redundancy may be implemented using either fully or partially redundant logic areas. Logic areas may be swapped to remap a partially redundant logic area onto a logic area containing a defect. The defect may then be repaired using row or column swapping or shifting. A logic circuit containing folded rows of logic areas may be repaired by replacing a defective half-row with a redundant half-row.

18 Claims, 18 Drawing Sheets

U.S. PATENT DOCUMENTS

| | | | |
|---|---|---|---|
| 3,805,039 | 4/1974 | Stiffler | 235/153 AE |
| 3,995,261 | 11/1976 | Goldberg | 340/173 BB |
| 4,020,469 | 4/1977 | Manning | 340/172.5 |
| 4,051,354 | 9/1977 | Choate | 235/312 |
| 4,124,899 | 11/1978 | Birkner et al. | 364/716 |
| 4,380,811 | 4/1983 | Götze et al. | 371/10 |
| 4,538,247 | 8/1985 | Venkateswaran | 365/230 |
| 4,551,814 | 11/1985 | Moore et al. | 364/716 |
| 4,566,102 | 1/1986 | Hefner | 371/11 |
| 4,609,986 | 9/1986 | Hartmann et al. | 364/200 |
| 4,617,479 | 10/1986 | Hartmann et al. | 307/462 |
| 4,641,285 | 2/1987 | Sasaki et al. | 365/210 |
| 4,677,318 | 6/1987 | Veenstra | 307/465 |
| 4,691,301 | 9/1987 | Anderson | 365/200 |
| 4,700,187 | 10/1987 | Furtek | 340/825.83 |
| 4,703,206 | 10/1987 | Cavlan | 307/465 |
| 4,706,216 | 11/1987 | Carter | 365/94 |
| 4,713,792 | 12/1987 | Hartmann et al. | 364/900 |
| 4,722,084 | 1/1988 | Morton | 371/9 |
| 4,774,421 | 9/1988 | Hartmann et al. | 307/465 |
| 4,791,319 | 12/1988 | Tagami et al. | 307/441 |
| 4,798,976 | 1/1989 | Curtin et al. | 307/441 |
| 4,800,302 | 1/1989 | Marum | 307/441 |
| 4,829,198 | 5/1989 | Maley et al. | 307/441 |
| 4,871,930 | 10/1989 | Wong et al. | 307/465 |
| 4,899,067 | 2/1990 | So et al. | 307/465 |
| 4,912,342 | 3/1990 | Wong et al. | 307/465 |
| 4,920,497 | 4/1990 | Upadhyaya et al. | 364/491 |
| 4,928,022 | 5/1990 | Marum | 307/241 |
| 5,019,736 | 5/1991 | Furtek | 307/465 |
| 5,045,720 | 9/1991 | Bae | 307/441 |
| 5,121,006 | 6/1992 | Pedersen | 307/465 |
| 5,163,023 | 11/1992 | Ferris et al. | 365/200 |
| 5,187,393 | 2/1993 | El Gamal et al. | 307/465.1 |
| 5,204,836 | 4/1993 | Reed | 365/200 |
| 5,220,214 | 6/1993 | Pedersen | 307/465 |
| 5,237,219 | 8/1993 | Cliff | 307/465 |
| 5,255,227 | 10/1993 | Haeffele | 365/200 |
| 5,255,228 | 10/1993 | Hatta et al. | 365/200 |
| 5,260,610 | 11/1993 | Pedersen et al. | 307/465 |
| 5,260,611 | 11/1993 | Cliff et al. | 326/39 |
| 5,325,334 | 6/1994 | Roh et al. | 365/201 |
| 5,369,314 | 11/1994 | Patel et al. | 326/13 |
| 5,426,379 | 6/1995 | Trimberger et al. | 326/39 |
| 5,434,514 | 7/1995 | Cliff et al. | 326/12 |
| 5,455,525 | 10/1995 | Ho et al. | 326/41 |
| 5,459,342 | 10/1995 | Nogami et al. | 257/209 |
| 5,471,427 | 11/1995 | Murakami et al. | 365/200 |
| 5,483,178 | 1/1996 | Costello et al. | 326/41 |
| 5,485,102 | 1/1996 | Cliff et al. | 326/10 |
| 5,498,975 | 3/1996 | Cliff et al. | 326/10 |
| 5,508,636 | 4/1996 | Mange et al. | 326/38 |
| 5,592,102 | 1/1997 | Lane et al. | 326/10 |
| 5,670,895 | 9/1997 | Kazarian et al. | 326/39 |

OTHER PUBLICATIONS

"On the Design of a Redundant Programmable Logic Array (RPLA)", C.–L. Wey et al., IEEE Journal of Solid State Circuits, vol. SC–22, No. 1, Feb. 1987, pp. 114–17.

Preliminary Data booklet for Altera 32 Macrocell High Density Max EPLD EPM5032, 1988, Altera Corporation.

"Programmable Logic Devices with Spare Circuits for Use in Replacing Defective Circuits", Altera Corporation.

"Laser Correcting Defects Transparent Routing for Larger Area FPGA's", G.H. Chapman and B. Dufort, FGPA '97–ACM/SIGDA International Symposium on Field Programmable Gate Arrays, 1997, pp. 17–23.

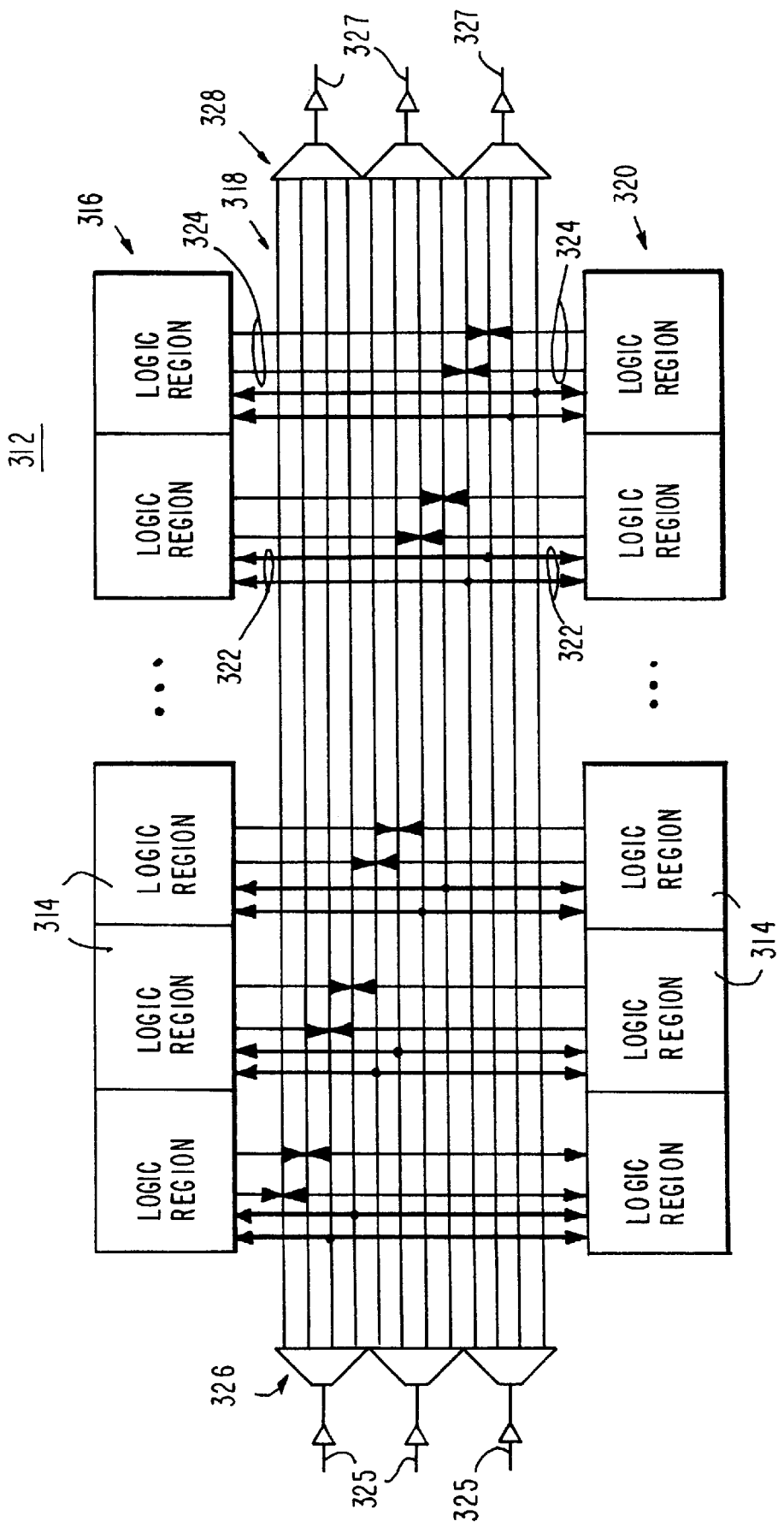

REDUNDANCY CIRCUITRY FOR LOGIC CIRCUITS

This application is a continuation of U.S. patent application Ser. No. 08/982,297, filed Dec. 1, 1997, which claims the benefit of U.S. provisional application Ser. No. 60/037,816, filed Feb. 5, 1997 and U.S. provisional application Ser. No. 60/042,004, filed Apr. 16, 1997.

BACKGROUND OF THE INVENTION

This invention relates to logic circuits, and more particularly, to redundancy circuitry for repairing logic circuits containing defects.

Logic circuits such as programmable logic devices are devices that may be programmed to perform custom logic functions. Integrated circuit fabrication techniques are not perfect, so occasionally a programmable logic device or other logic circuit is fabricated with a defect. Unless the defect can be corrected before the logic circuit is put into use, the logic circuit must be discarded. Discarding such circuits is wasteful, particularly when the defects are relatively minor.

As a result, various redundancy schemes have been developed which allow spare circuitry to be switched into place to repair a defective portion of a circuit. In programmable logic devices, such redundancy schemes often involve the programming of multiplexer switches to redirect signals to a spare region of logic rather than the defective region of logic.

To reduce the amount of overhead required to provide redundancy, logic is often replaced in fairly large blocks. For example, in programmable logic devices that contain logic arranged in rows and columns, an entire row or column of logic may be replaced, even if a defect only affects a portion of the row or column.

Although such redundancy schemes can be implemented using a relatively small amount of circuitry, it is sometimes wasteful of logic resources to replace such large regions of logic at a time. This is a particular concern as integrated circuits increase in size.

It is therefore an object of the present invention to provide improved redundancy arrangements.

It is a further object of the present invention to provide redundancy arrangements that are satisfactory for repairing large integrated circuits.

SUMMARY OF THE INVENTION

These and other objects of the invention are accomplished in accordance with the principles of the present invention by providing redundancy circuitry for logic circuits having rows and columns of logic areas. Redundancy may be provided using one of the logic areas as a redundant logic area. When a defect is detected in one of the other logic areas, the redundant logic area can be switched into place to repair the logic circuit.

The redundant logic area is switched into place by dynamically routing the programming data for the various logic areas on the device to the logic areas in a suitable order. For example, the programming data for two given columns of logic areas may be swapped by dynamically routing the programming data for one column to the other and vice versa. This approach allows non-adjacent rows and columns of logic areas to be swapped with each other. A defective logic area can be replaced by the redundant logic area by swapping appropriate rows and columns of logic areas.

The order in which the logic areas receive programming data may be determined based on redundancy configuration data stored on the circuit by the manufacturer when the circuit is being repaired. During programming, programming data dynamic routing control circuitry on the logic circuit directs the programming data to the appropriate logic areas in the order determined by the redundancy configuration data. Repairing the logic circuit in this way is transparent to the user, because the dynamic routing of the programming data during device programming does not change the way in which the logic circuit is programmed and does not affect the operation of the device.

If desired, redundancy may be provided using a partially redundant logic area. For example, the logic areas on a logic circuit may be logic super-regions each of which contain rows and columns of smaller logic regions. In such logic circuits, redundancy can be provided by a single row or column of logic regions or by a single logic region in a given logic super-region. Redundancy may also be provided by a redundant half-row of logic regions in a folded row configuration within one of the logic super-regions.

To repair a defect on a logic circuit when a partially redundant logic super-region is used, the partially redundant logic super-region is logically remapped to coincide with the defective logic super-region by swapping appropriate rows and columns of logic super-regions. Once the partially redundant logic super-region has been logically remapped to coincide with the defective logic super-region, the redundant portion of the partially redundant logic super-region can be shifted or swapped into place using various logic region shifting and swapping schemes.

Further features of the invention, its nature and various advantages will be more apparent from the accompanying drawings and the following detailed description of the preferred embodiments.

BRIEF DESCRIPTION OF THE DRAWINGS

FIGS. 17 and 18 are schematic diagrams showing how redundancy may be implemented in folded-row logic super-region arrangements in accordance with the present invention.

DETAILED DESCRIPTION OF THE PREFERRED EMBODIMENTS

The present invention allows logic on a programmable logic device or other suitable logic circuit to be remapped so that a defective logic area may be replaced by a spare or redundant logic area. Logic remapping involves the dynamic routing of programming data during programming of the device. Programming data is dynamically routed in both the horizontal and vertical dimensions, so that it is not necessary to provide an entire row or column of redundant logic areas to repair a logic circuit containing a single defective logic area.

Figure 1:
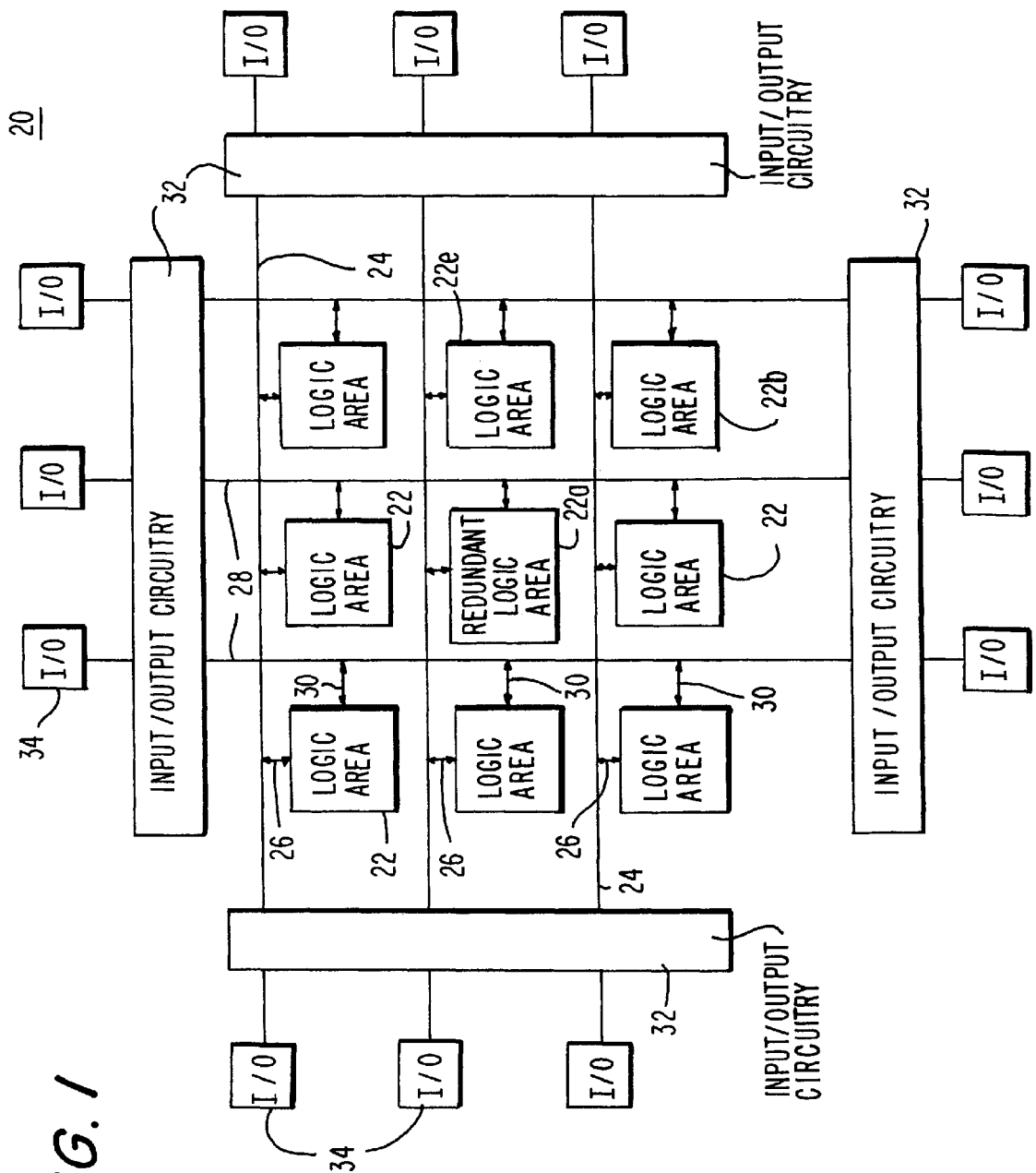
FIG. 1 is a schematic diagram of a programmable logic device integrated circuit containing rows and columns of programmable logic areas that may be logically remapped in accordance with the present invention.

An illustrative programmable logic device 20 in accordance with the present invention is shown in FIG. 1. Although logic circuits other than programmable logic devices may use the redundancy scheme of the present invention, for clarity the invention will be described primarily in connection with programmable logic devices.

Programmable logic device 20 contains logic areas 22, which may be programmed to perform various logic functions by providing logic areas 22 with appropriate programming data. Logic areas 22 may be based on look-up table logic, product-term logic, or any other suitable type of programmable logic. If desired, logic areas 22 may contain register logic. Logic areas 22 may be relatively simple or may be sophisticated enough to provide the logic functions that are sometimes provided on stand-alone programmable logic device integrated circuits.

Logic areas 22 are preferably arranged on logic device 20 in rows and columns. Horizontal interconnections 24 are used to route signals horizontally, between the logic areas 22 in a row. Each row typically contains numerous horizontal interconnections 24. Logic areas 22 are connected to interconnections 24 via input/output connectors 26. Vertical interconnections 28 are used to route signals vertically, between the logic areas 22 in a column. Each column typically contains numerous vertical interconnections 28. Logic areas 22 are connected to interconnections 28 via input/output connectors 30. At the periphery of programmable logic device 20, input/output routing circuitry 32 is used to connect interconnections 24 and 28 to input/output pads 34. There are typically numerous input/output pads 34 associated with each row and column.

At least one of logic areas 22, such as logic area 22a, is a redundant logic area. The redundant logic area 22a is typically equivalent in hardware to other logic areas 22, but is distinguished in that it is unused on a defect-free device. During the manufacturing process, programmable logic device 20 is tested to see if any of logic areas 22 are defective. If a defective area is located, the redundant logic can be switched into use. For example, if a defect is located in logic area 22b during testing, programmable logic device 20 may be repaired by replacing logic area 22b with logic area 22a.

The process of repairing a logic device that contains defective circuitry involves remapping the logic of the redundant logic area (i.e., the normally unused logic area on a defect-free device) into the defective logic area by redirecting the programming data that would normally have been directed into the defective logic area into the redundant logic area and by redirecting the programming data that would normally have been used by the redundant logic area to ensure that the redundant logic area is inactive or unused on a defect-free device into the defective logic area.

Accordingly, when replacing a defective area of programmable logic, the manufacturer permanently configures programmable logic device 20 so that whenever a user programs device 20, the programming data intended for the defective logic area (e.g., logic area 22b) is automatically rerouted to the redundant logic area (e.g., redundant logic area 22a). Because programmable logic device 20 is configured by the manufacturer before device 20 is shipped to the user, such repairing of the programmable logic device using redundant circuitry is transparent to the user.

Replacing defective logic area 22b with redundant logic area 22a by redirecting the programming data for device 20 may be accomplished using a two-dimensional logical remapping operation in which the center column of logic areas 22 is swapped with the right column of logic areas 22 and the center row of logic areas 22 is swapped with the bottom row of logic areas 22. Such swapping operations remap the logical configuration of programmable logic device 20, so that the logic functions that were originally to be performed by defective logic area 22b are performed by the logic in redundant logic area 22a.

The input/output connectors 30 between the logic areas 22 in each column and the vertical interconnections 28 in that column are preferably all identical. This allows rows to be swapped without affecting the pattern of programming data provided to the drivers of the input/output connectors 30 associated with the swapped logic areas 22. Similarly, the input/output connectors 26 between the logic areas 22 in each row and the horizontal interconnections 24 in that row are preferably all identical. This allows columns to be swapped without affecting the pattern of programming data provided to the drivers of the input/output connectors 26 associated with the swapped logic areas.

When two rows of logic areas 22 are swapped, the input/output circuitry associated with the horizontal interconnections 24 on which the signals for the swapped logic areas 22 appear are also swapped. Similarly, when columns of logic areas 22 are swapped, the input/output circuitry associated with the vertical interconnections 28 on which the signals for the swapped logic areas appear are also swapped. In order to make the repaired programmable logic device 20 indistinguishable to the user from a perfect programmable logic device 20, programming data is provided to input/output circuitry 32 such that the signals from the swapped horizontal interconnections 24 and the swapped vertical interconnections 28 are routed back to the input/output pads 34 with which they were originally associated.

Figure 2:
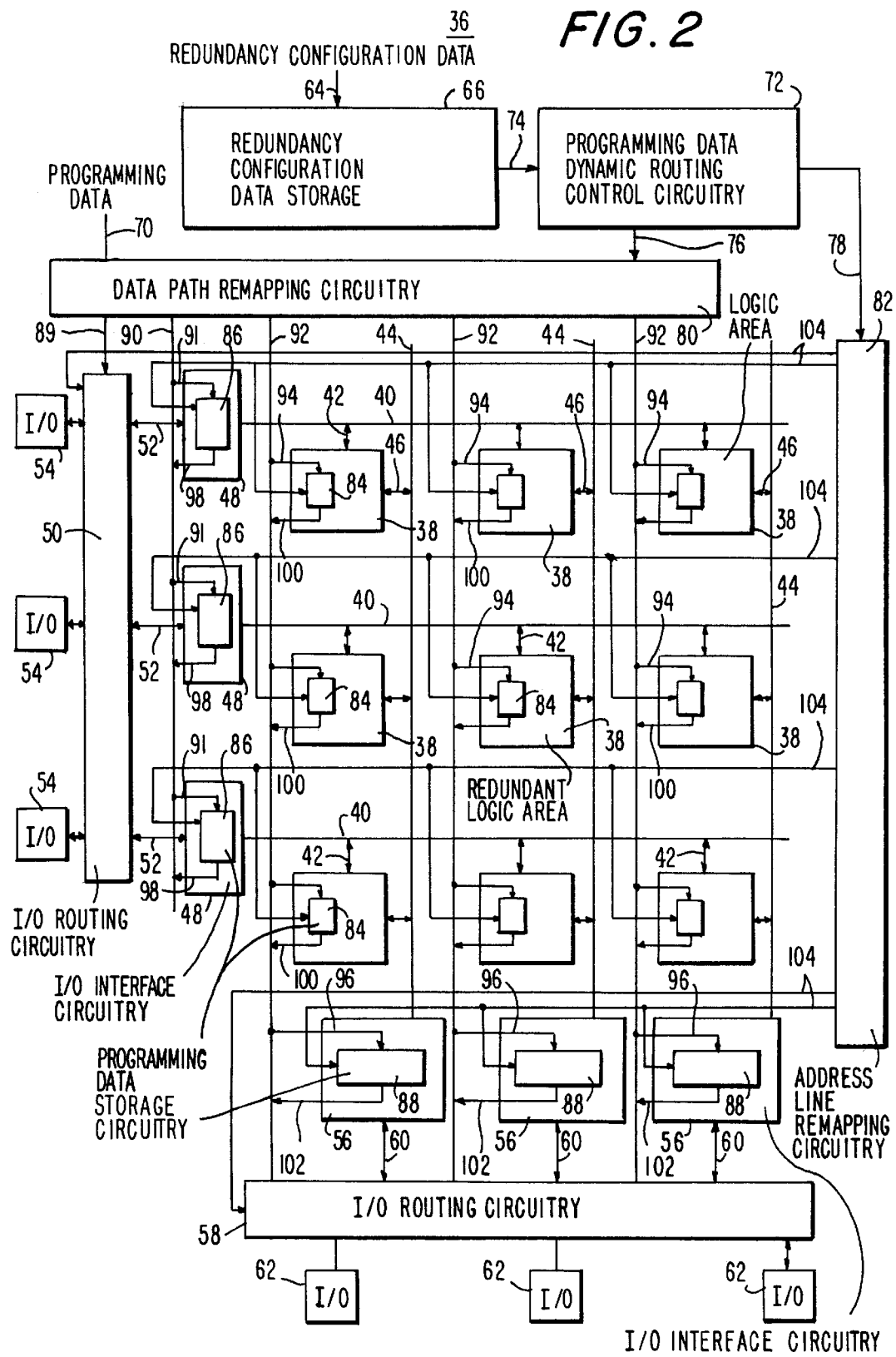
FIG. 2 is a schematic diagram of an illustrative programmable logic device of the general type shown in FIG. 1.

An illustrative implementation of the programmable logic device arrangement of FIG. 1 is shown in FIG. 2. Logic areas 38 of programmable logic device 36 are arranged in rows and columns. Logic areas 38 are connected to horizontal interconnections 40 by input/output connectors 42. Logic areas 38 are connected to vertical interconnections 44 by input/output connectors 46. There are preferably numerous interconnections in each row of horizontal interconnections 40 and in each column of interconnections 44.

Input/output interface circuitry 48 is provided at the end of each group of horizontal interconnections 40 in a row. Input/output interface circuitry 48 contains multiplexing circuitry that allows the user to selectively connect desired horizontal interconnections 40 in a row to input/output routing circuitry 50 via paths 52. Input/output routing circuitry 50 connects paths 52 to input/output pads 54. There are preferably numerous input/output pads 54 in each row.

Input/output interface circuitry 56 is provided at the end of each group of vertical interconnections 44 in a column. Input/output interface circuitry 56 contains multiplexing circuitry that allows the user to selectively connect desired vertical interconnections 44 in a column to input/output routing circuitry 58 via paths 60. Input/output routing circuitry 58 connects paths 60 to input/output pads 62. There are preferably numerous input/output pads 62 in each column.

In order to avoid over-complicating the drawing of FIG. 2, input/output interface circuitry 48, input/output routing circuitry 50, and input/output pads 54 are only shown on the left side of programmable logic device 36. However, programmable logic device 36 preferably has similarly connected input/output interface circuitry, input/output routing circuitry, and input/output pads on the right side of programmable logic device 36. Similarly, although input/output interface circuitry 56, input/output routing circuitry 58, and input/output pads 62 are only shown on the bottom side of programmable logic device 36, programmable logic device 36 preferably has similarly connected input/output interface circuitry, input/output routing circuitry, and input/output pads on the top side of programmable logic device 36. Moreover, although programmable logic device 36 of FIG. 2 is shown having three rows and three columns of programmable logic areas 38, any suitable number of rows and columns of logic areas 38 may be used.

During the manufacturing process for programmable logic device 36, programmable logic device 36 is tested. If it is determined that one of logic areas 38 is defective, then the manufacturer provides redundancy configuration data to programmable logic device 36 at input 64 that identifies which logic area 38 is defective. The redundancy configuration data is used by programmable logic device 36 to redirect programming data into a redundant logic area (i.e., the center logic area 38) instead of the defective logic area. In addition, the programming data that normally ensures that the redundant logic area is inactive or unused is redirected into the defective logic area, thereby ensuring that the defective logic area is inactive or unused. Redundancy configuration data may be stored in redundancy configuration data storage 66.

A programmable logic device programmer (not shown) may be used to store the redundancy configuration data in storage 66.

Input/output routing circuitry 50 and 58, reroutes the input/output signals associated with input/output pads 54 and 62, so that the replacement of defective circuitry by redundant circuitry does not affect the input/output pad arrangement of device 36. Input/output routing circuitry 50 and 58 also provides the user of programmable logic device 36 with a more flexible set of routing options to and from input/output pads 54 and 62 than would otherwise be possible.

Programming data is provided by a user to programmable logic device 36 at input 70. Programming data is used to configure the programmable logic of programmable logic areas 38 (including the associated drivers for connectors 42 and 46), input/output interface circuitry 48 and 58, and input/output routing circuitry 50 and 58. Programmable logic in programmable logic device 36 may be based on static random-access memory, programmable read-only memory, erasable programmable read-only memory, electrically-erasable programmable read-only memory, fuses, antifuses, or any other suitable technology. The programming data used to configure programmable logic areas 38, input/output interface circuitry 48, and input/output interface circuitry 56 is stored in programming data storage circuitry 84, programming data storage circuitry 86, and programming data storage circuitry 88, respectively. The programming data used to configure input/output routing circuitry 50 and 58 is stored in programming data storage circuitry within input/output routing circuitry 50 and 58, which is not shown separately in FIG. 2 to avoid over-complicating the drawing. In one embodiment, the programming data storage circuitry 84, 86, and 88 and the programming data storage circuitry of input/output routing circuitry 50 and 58 is a series of parallel first-in-first-out (FIFO) data register chains. There are preferably numerous such FIFO chains in each column of programmable logic device 36.

Programming data dynamic routing control circuitry 72 receives the redundancy configuration data from data storage 66 at input 74 and generates dynamically-varying control signals on outputs 76 and 78 based on the redundancy configuration data. The control signals on outputs 76 and 78 cause data path remapping circuitry 80 and address line remapping circuitry 82 to dynamically route the programming data from input 70 to the appropriate portions of programmable logic areas 38, input/output interface circuitry 48 and 56, and input/output routing circuitry 50 and 58 in an order that is based upon the redundancy configuration data.

Programming data is provided to blocks of programming data storage circuitry 86 in the input/output interface circuitry 48 of each row using data path 90 and input paths 91. Output paths 98 are used to direct programming data from programming data storage circuitry 86 to data path 90 for testing purposes. Test data from data path 90 is passed to input/output pads such as input/output pads 62 using circuitry that is not shown in FIG. 2.

Programming data may be provided to the programming data storage circuitry in input/output routing circuitry 50 on data path 89. Programming data may be routed within input/output routing circuitry 50 using an input path arrangement such as the one used for input/output interface circuitry 48. Data may be read out from the programming data storage circuitry in input/output routing circuitry 50 for testing purposes.

Programming data storage circuitry 84 in each logic area 38 receives programming data from data path remapping circuitry 80 via data paths 92 and input paths 94. Test data may be read out from programming data storage circuitry 84 via output paths 100.

Programming data is provided to programming data storage circuitry 88 in the input/output interface circuitry 56 of each column using data paths 92 and input paths 96. Output paths 102 direct programming data from programming data storage circuitry 88 to data paths 92 for testing purposes. Test data from data paths 92 is passed to input/output pads such as input/output pads 62 using input/output routing circuitry 58.

Programming data may be provided to the programming data storage circuitry in input/output routing circuitry 58 on data paths 92. Data may be read out from the programming data storage circuitry in input/output routing circuitry 58 for testing purposes.

Paths 90, 91, 92, 94, 96, 98, 100, and 102 are depicted as single data paths in FIG. 2 to avoid over-complicating the drawing. However, each of these depicted data paths preferably contains multiple individual conductors, so that programming data may be routed in parallel. Similarly, each block of programing data storage circuitry 84, 86, and 88 and each block of programming data storage circuitry in input/output routing circuitry 50 and 58 preferably contains a number of programming data register chains, each of which is associated with one of the input conductors to that block, so that programming data may be stored in the programming data storage circuitry blocks in parallel. Each programming data bit stored in the programming data storage circuitry configures part of the programmable logic in programmable logic device 36. If desired, vertical signal paths such as vertical interconnections 44 may be used to provide the programming data routing path functions of paths 90 and 92 during programming.

The arrangement of FIG. 2 allows programming data to be loaded into the programming data storage circuitry of device 36 in various orders. For example, if the left and center columns of logic areas 38 are to be swapped, programming data originally intended for the left column may be provided to the center column of logic array 36 via the center data path 92 and programming data originally intended for the center column may be provided to the left column via the left data path 92.

Row swapping is accomplished by controlling the order in which address control signals are applied to the rows of logic areas 38. Address line remapping circuitry 82 generates address control signals on address control lines 104. Each row of programmable logic device 36 contains a set of address control lines 104. Each address control line 104 in a row is used to address a corresponding programming data storage circuitry data bit in that row. Address control lines 104 are also used to address programming data storage circuitry data bits in the programming data storage circuitry of input/output routing circuitry 50 and 58 and input/output interface circuitry 48 and 56.

Programming data is only routed into the programming data storage circuitry of device 36 if the associated set of address control lines 104 is activated by the address line remapping circuitry 82. For example, if the top and bottom rows of programmable logic device 36 are to be swapped, then programming data originally intended for logic areas in the top row may be provided to the bottom row by activating the address control lines 104 in the bottom row. Programming data originally intended for logic areas in the bottom row may be provided to the top row by activating the address control lines 104 in the top row. When the address control lines 104 in a row are activated and programming data is present on the appropriate data path 90 or 92, the data from the data path 90 or 92 is taken off the data path 90 or 92 and stored in programming data storage circuitry 84, 86, or 88. If desired, a switch controlled by an address control line 104 may be provided at the input of each block of programming data storage circuitry 84, 86, and 88 to selectively pass the data from data paths 90 and 92 into programming data storage circuitry 84, 86, or 88.

Although the arrangement of FIG. 2 uses vertical data paths 90 and 92 and horizontal address lines 104, horizontal data paths 90 and 92 and vertical address lines 104 may be used if desired.

Figure 3:
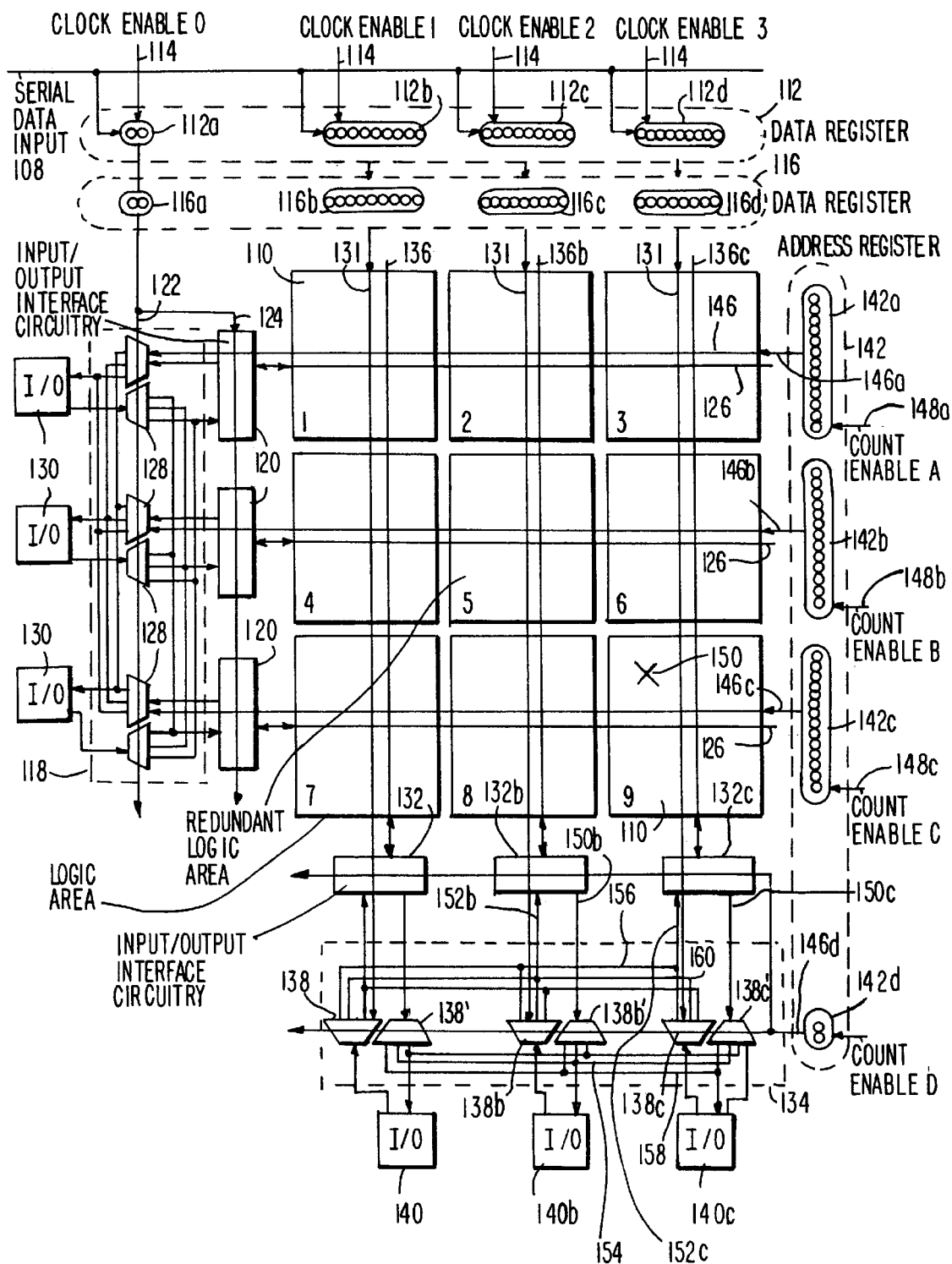
FIG. 3 is a schematic diagram of an illustrative programmable logic device of the type shown in FIGS. 1 and 2 in which details of the circuitry used to program the input/output routing circuitry and details of the remapping circuitry are shown.

Any suitable arrangement may be used to dynamically route the programming data to the appropriate programmable data storage circuitry under the real time control of suitable programming data dynamic routing control circuitry. One such arrangement is shown in FIG. 3. In programmable logic device 106 of FIG. 3, programming data is supplied to input 108. A programmable logic device programmer (not shown in FIG. 3) may be used to supply the programming data to input 108. The programming data specifies the logic design to be implemented on programmable logic device 106.

The programming data from input 108 is provided to logic areas 110 (of which the center logic area is redundant) via data registers 112 and 116. Data is initially loaded into data registers 112a, 112b, 112c, and 112d in an order determined by the order in which clock enable signals on clock enable lines 114 are applied to registers 112a, 112b, 112c, and 112d by programming data dynamic routing control circuitry 72 (FIG. 2). For example, if the first clock enable signal that is applied to register 112 is clock enable 2, programming data is first loaded into register 112c. After the programming data has been loaded into registers 112a–d, it is shifted in parallel to data register 116, so that additional programming data may be loaded into register 112 while the programming data from register 116 is provided to logic areas 110.

Programming data from register 116a is provided to input/output routing circuitry 118 and input/output interface circuitry 120 via data paths 122 and 124, respectively. Input/output interface circuitry 120 is connected to horizontal interconnections 126 and performs the same functions as input/output interface circuitry 48 of FIG. 2. Input/output routing circuitry 118 contains programmable multiplexers 128 (configured as demultiplexers) for redirecting the input and output signals between input/output interface circuitry 120 and input/output pads 130 when rows of logic areas 110 are swapped. There are preferably numerous input/output pads 130 and multiplexers 128 associated with each row.

Programming data from registers 116b, 116c, and 116d is provided to the programming data storage circuitry in logic areas 110 via data paths 131. Programming data from registers 116b, 116c, and 116d is also provided to the programming data storage circuitry in input/output interface circuitry 132 and in input/output routing circuitry 134 via data paths 131. Input/output interface circuitry 132 is connected to vertical interconnections 136 and performs the same functions as input/output interface circuitry 56 of FIG. 2. Input/output routing circuitry 134 contains programmable multiplexers 138 (configured as demultiplexers) for redirecting the input and output signals between input/output interface circuitry 132 and input/output pads 140 when columns of logic areas 110 are swapped. There are preferably numerous input/output pads 140 and multiplexers 138 associated with each column.

Rows of logic areas 110 may be swapped by controlling the sequence with which address register 142 applies address control signals to the various blocks of programming data storage circuitry in device 106. Address register 142 generates address control signals on address lines 146 in response to count enable signals applied to count enable inputs 148 by programming data dynamic routing control circuitry 72 (FIG. 2). These address control signals cause data bits from the appropriate data path to be sequentially drawn into the programming data storage circuitry being programmed.

If it is desired to program the top row of logic areas 110 (or the input/output routing circuitry 118 and input/output interface circuitry 120 in the top row), then count enable A at count enable input 148a is activated, which causes address register 142 to generate address control signals on address control lines 146a that cause the programming data for the top row to be drawn into the programming data storage circuitry of the top row. If it is desired to program the center row, then count enable B at count enable input 148b of register 142b is activated. To program the bottom row, count enable C at count enable input 148c of register 142c is activated. Activating count enable D of address register 142d causes address control signals to be provided to input/output interface circuitry 132 and input/output routing circuitry 134 via address control lines 146d.

With the arrangement of FIG. 3, the programming data for one row of device 106 (including logic areas 110, input/output routing circuitry 118, and input/output interface circuitry 120) can be swapped with the programming data for another row by activating the count enable signals for the rows in the appropriate order. This technique is referred to as address remapping.

The programming data for one column of device 106 (including logic areas 110, input/output routing circuitry 134, and input/output interface circuitry 132) can be swapped with the programming data for another column by activating the clock enable signals for the columns in the appropriate order. This technique is referred to as data remapping. The order in which the clock and count enable signals are supplied by programming data dynamic routing control circuitry 72 (FIG. 2) is determined based on the redundancy configuration data stored in redundancy configuration data storage 66 (FIG. 2).

If a defect 150 is detected in logic area No. 9, then redundant logic area No. 5 can be used to replace logic area No. 9. Once the defect has been located, redundancy configuration data identifying the location of the defect is stored by the manufacturer in redundancy configuration data storage 66 (FIG. 2). When the user programs the device, programming data dynamic routing control circuitry 72 (FIG. 2) automatically uses data remapping to swap the last two columns of device 106 and uses address remapping to swap the last two rows of device 106 based on the stored redundancy configuration data. This causes the programming data that would have been used by logic area No. 9 to be redirected to redundant logic area No. 5 and vice versa. (It also causes the logic of areas 2 and 3 to be swapped, the logic of areas 6 and 8 to be swapped, and the logic of areas 4 and 7 to be swapped.)

Swapping the last two columns of device 106, causes signals that would have appeared on vertical interconnections 136c to appear on vertical interconnections 136b and vice versa. Because swapping the last two columns of device 106 also causes the programming data for input/output interface circuitry 132b to be swapped with the programming data for input/output interface circuitry 132c, output signals from vertical interconnections 136c in the swapped configuration are routed to output line 150c in the same way that output signals from vertical interconnections 136b would have been routed to output line 150b in the unswapped configuration. Moreover, output signals from vertical interconnections 136b in the swapped configuration are routed to output line 150b in the same way that output signals from vertical interconnections 136c would have been routed to output line 150c in the unswapped configuration.

Similarly, input signals on input line 152c are routed to vertical interconnections 136c in the swapped configuration in the same way that input signals on input line 152b would have been routed to vertical interconnections 136b in the unswapped configuration. Input signals on input line 152b are routed to vertical interconnections 136b in the swapped configuration in the same way that input signals on input line 152c would have been routed to vertical interconnections 136c in the unswapped configuration.

In order to preserve the unswapped input/output pin configuration of device 106 after swapping, input/output routing circuitry redirects the input and output signals from input/output pads 140.

Accordingly, after the last two columns have been swapped, output signals on output line 150c are redirected back to input/output pad 140b by multiplexer 138c' and line 154. Output signals on output line 150b are redirected back to input/output pad 140c by multiplexer 138b' and line 158. Input signals from input/output pad 140b are redirected to vertical interconnections 136c via multiplexer 138b and line 156. Input signals from input/output pad 140c are redirected to vertical interconnections 136b via multiplexer 138c and line 160.

When the last two rows of device 106 are swapped, the signals paths between horizontal interconnections 146b and 146c and input/output pads 130b and 130c are redirected using the same approach. In addition, signal paths between interconnections and input/output pads are redirected in this way regardless of which rows or columns are being swapped or whether the swapped rows or columns are adjacent to one another.

The redundancy scheme described in connection with FIGS. 1–3 may be used to repair programmable logic devices in which the logic areas are fairly large. Programmable logic devices made up of large logic areas particularly benefit from the approach of FIGS. 1–3, because the savings associated with using a single redundant logic area to provide redundancy rather than an entire row or column of logic areas typically outweigh the overhead costs of using such a redundancy scheme.

In accordance with another aspect of the invention, a programmable logic device containing large logic areas may be repaired using even less redundant logic. For example, redundancy for the entire device may be provided by adding a single extra row or column of logic to one of the logic areas. Row and column swapping may be used to remap the logic area containing the extra row to the location occupied by logic area containing a defect. Shifting or swapping techniques may then be used to repair the logic area containing the defect using the extra row or column of logic.

Figure 4:
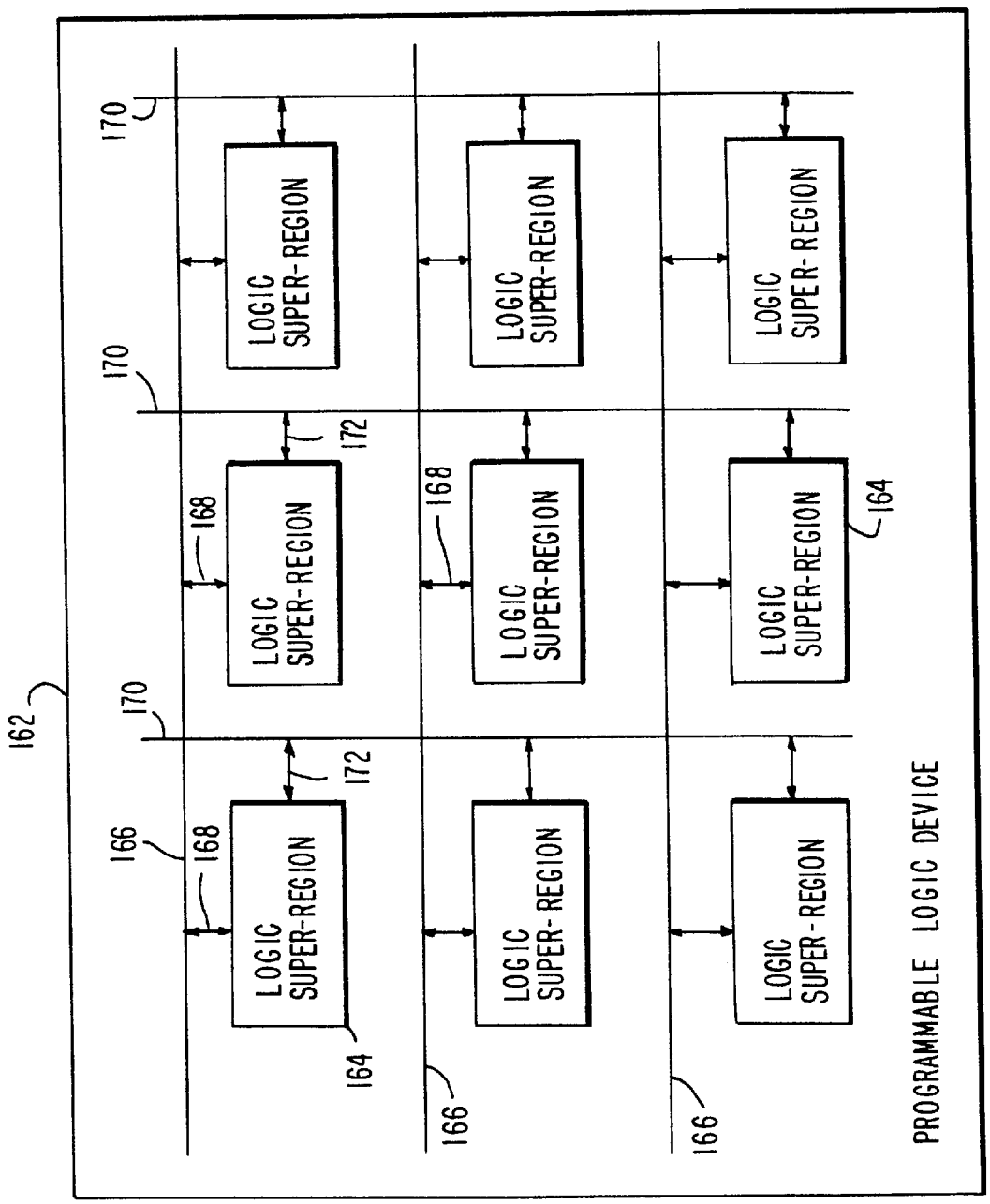
FIG. 4 is a schematic diagram of an illustrative programmable logic device in accordance with the present invention that contains an array of logic super-regions.

A schematic diagram of an illustrative programmable logic device 162 containing relatively large logic areas called logic super-regions is shown in FIG. 4. Logic super-regions 164 are arranged in rows and columns. Each row has an associated set of horizontal interconnections 166 to which the logic super-regions in that row are connected via connectors 168. Each column has an associated set of vertical interconnections 170 to which the logic super-regions 164 in that column are connected via connectors 172. Input/output pads and various other components described above in connection with FIGS. 1–3 have not been reproduced in FIG. 4 to avoid over-complicating the drawing. Nevertheless, the rows and columns of logic super-regions 168 may be logically remapped by swapping various pairs of rows and/or columns, as described in connection with FIGS. 1–3.

Figure 5:
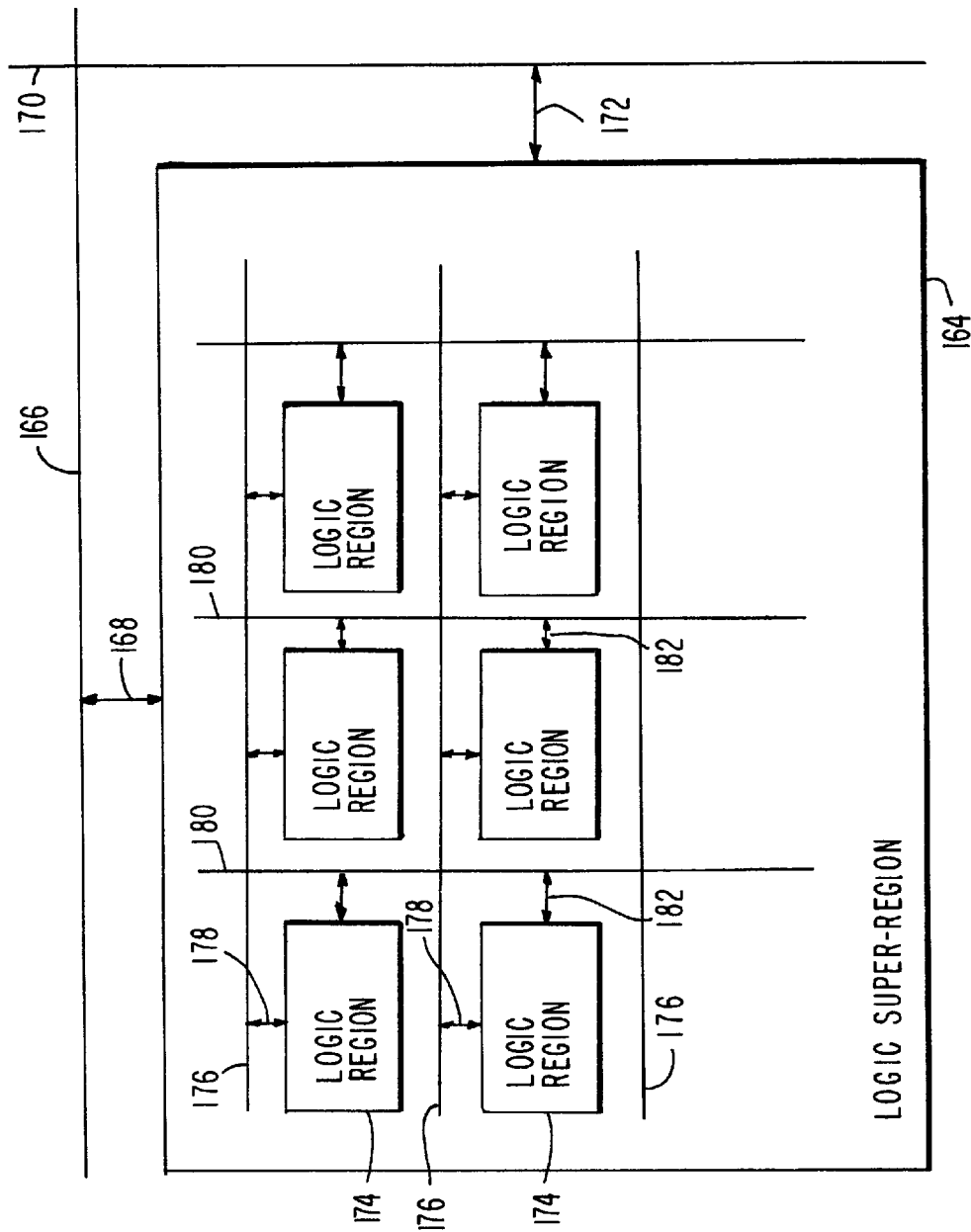
FIG. 5 is a schematic diagram of an illustrative one of the logic super-regions of FIG. 4, which contains an array of logic regions in accordance with the present invention.

Each logic super-region 164 of FIG. 4 contains a number of smaller logic regions 174, as shown in FIG. 5. Logic regions 174 are preferably arranged in rows and columns.

Each row of logic regions 174 has an associated set of horizontal interconnections 176 to which logic regions 174 are connected by connectors 178. In contrast to connectors 168 of FIG. 4, which each form the same pattern of connections to interconnections 166 (thereby allowing column swapping), connectors 178 may or may not form identical patterns of connections to interconnections 176.

Each column of logic regions 174 has an associated set of vertical interconnections 180 to which logic regions 174 are connected by connectors 182. Connectors 182 may or may not form identical patterns of connections to interconnections 180.

Input/output circuitry (not shown in FIG. 5) around the periphery of logic super-region 164 is used to route signals between interconnections 176 and 180 and connectors 168 and 172.

Figure 6:
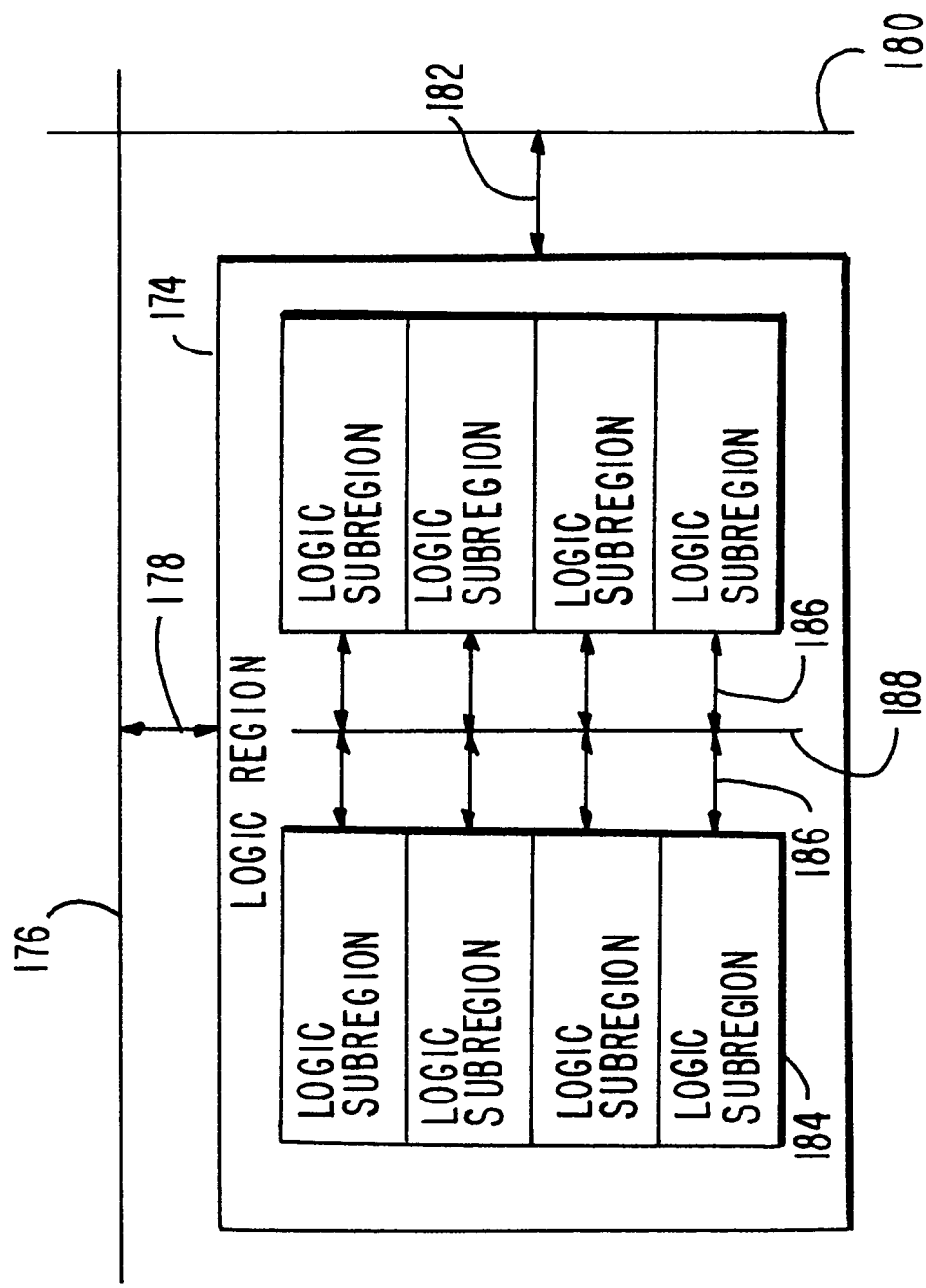
FIG. 6 is a schematic diagram of an illustrative one of the logic regions of FIG. 5, which contains an array of logic subregions in accordance with the present invention.

As shown in FIG. 6, each logic region 174 may contain a number of logic subregions 184 (sometimes called macrocells). Logic subregions 184 may be based on look-up table logic, product term logic, or any other suitable type of logic and may contain register logic if desired. Logic subregions 184 may be interconnected by connectors 186 and interconnections 188.

Figure 7:
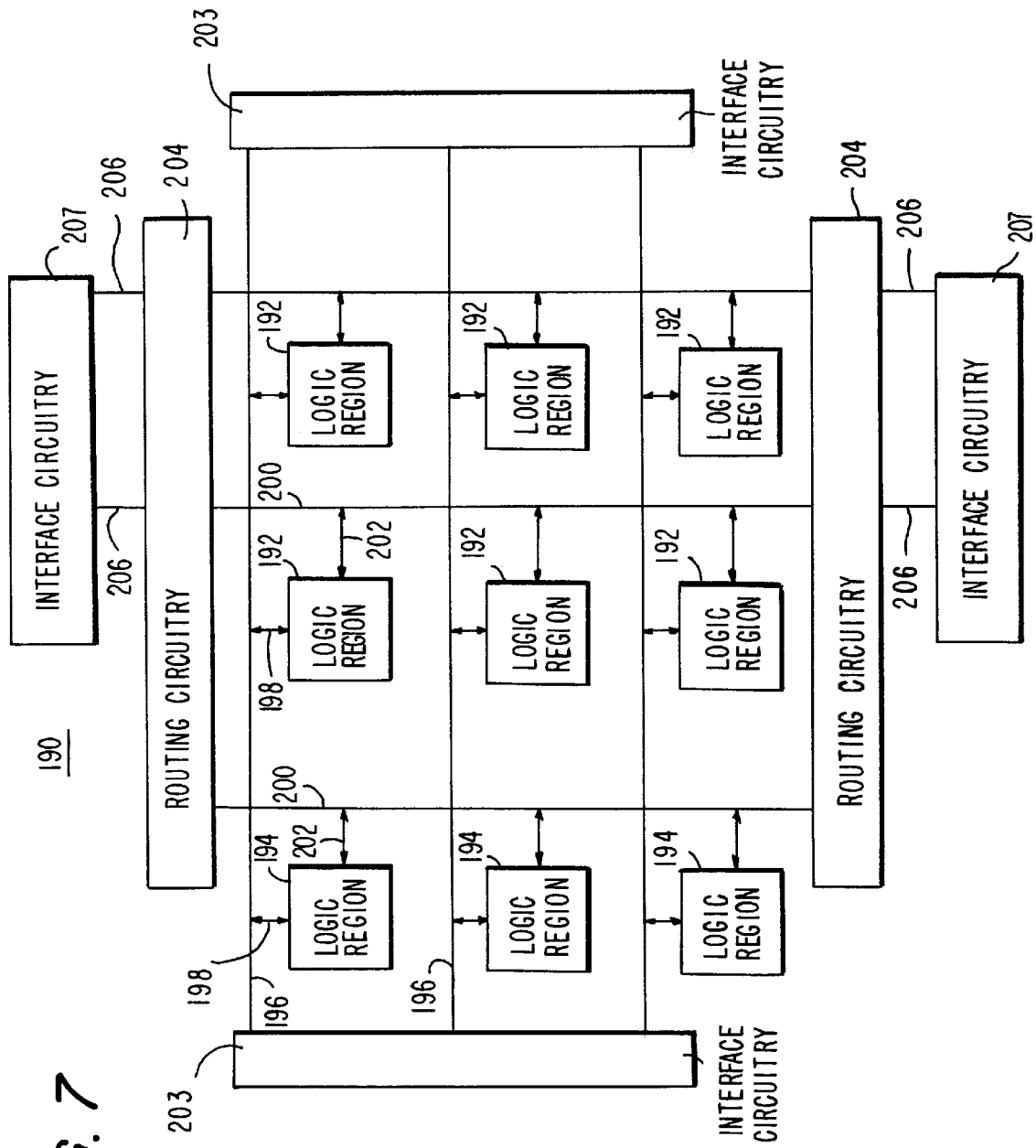
FIG. 7 is a schematic diagram of an illustrative programmable logic device in accordance with the present invention in which defective logic may be repaired by column shifting.

Various row and column shifting techniques may be used when repairing a defect with a partially redundant logic super-region. An illustrative logic super-region 190 suitable for column-shifting redundancy is shown in FIG. 7. Logic regions 192 are regular logic regions, which may contain logic of the type shown in FIG. 6. Logic regions 194 are redundant logic regions, which may be used if one of regular logic regions 192 is found to contain a defect.

Logic regions 192 and 194 are connected to interconnections 196 by connectors 198 and are connected to interconnections 200 by connectors 202. Interconnections 196 are connected to interconnections such as interconnections 170 of FIG. 5 by interface circuitry 203 and connectors such as connectors 172 of FIG. 5. Routing circuitry 204 is used to route signals between vertical interconnections 200 and input/output lines 206. Input/output lines 206 are connected to interconnections such as interconnections 166 of FIG. 5 by interface circuitry 207 and connectors such as connectors 168 of FIG. 5.

If desired, interface circuitry 203 may be connected to horizontal interconnections such as interconnections 166, rather than to vertical interconnections such as interconnections 170, and interface circuitry 207 may be connected to vertical interconnections such as interconnections 170, rather than to horizontal interconnections such as interconnections 166.

If no defects are detected in logic super-region 190, redundant logic regions 194 are not used. Routing circuitry 204 routes signals between the rightmost two columns of logic super-region 190 and input/output lines 206.

If a manufacturer detects a defect in, for example, the rightmost column of logic super-region 190, then logic regions 192 in the center column are shifted one column to the right to take the place of the defective logic regions 192. Redundant logic regions 194 are also shifted one column to the right to take the place of the logic regions 192 that have been shifted to the right to replace the defective column.

During subsequent operation of logic super-region 190, routing circuitry 204 redirects the input/output signals on input/output lines 206 to redundant logic regions 194 and the left column of regular logic regions 192, so that these columns of logic can perform the logic functions that would normally have been performed by the left and right columns of logic regions 192.

Figure 8:
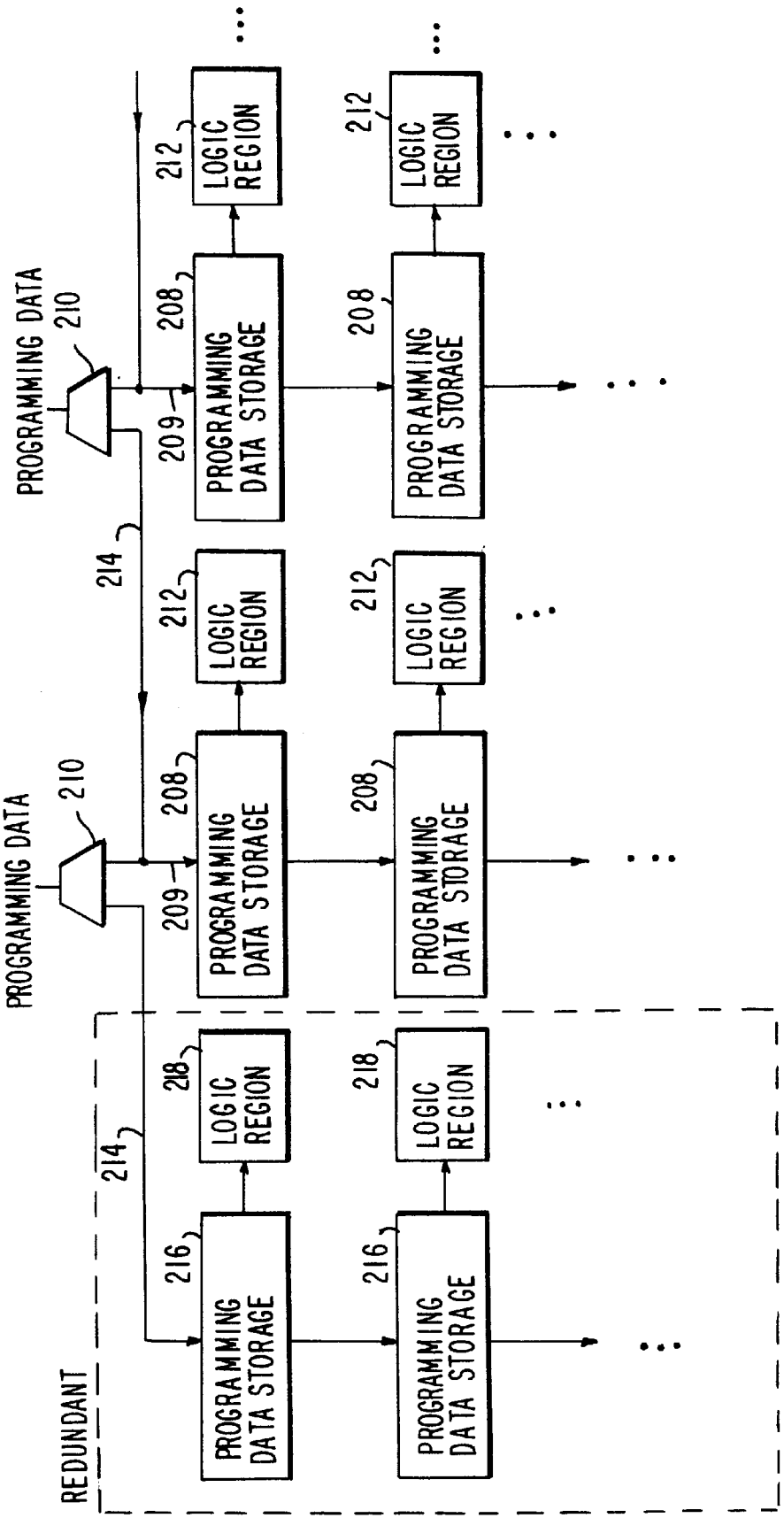
FIG. 8 is a schematic diagram of a portion of an illustrative programmable logic device in accordance with the present invention showing how multiplexers may be used to shift programming data away from a column of logic that contains a defect.

To completely shift the redundant logic into place to repair a defect, it is also necessary to shift the programming data for the device into the appropriate columns of logic regions during programming. As shown in FIG. 8, programming data in each regular column of logic is normally passed to programming data storage 208 in that column via an output line 209 of an associated multiplexer 210. Programming data stored in programming data storage 208 is applied to associated logic regions 212 to implement the logic design desired by the user. If a defect is detected in, for example, the right column of logic regions 212 in FIG. 8, then multiplexers 210 are configured by the manufacturer to redirect programming data to output lines 214. This shifts programming data from the left multiplexer 210 into programming data storage 216 in the redundant column where it is applied to redundant logic regions 218 and shifts programming data from the right multiplexer 210 into the left column of programming data storage 208.

Figure 9:
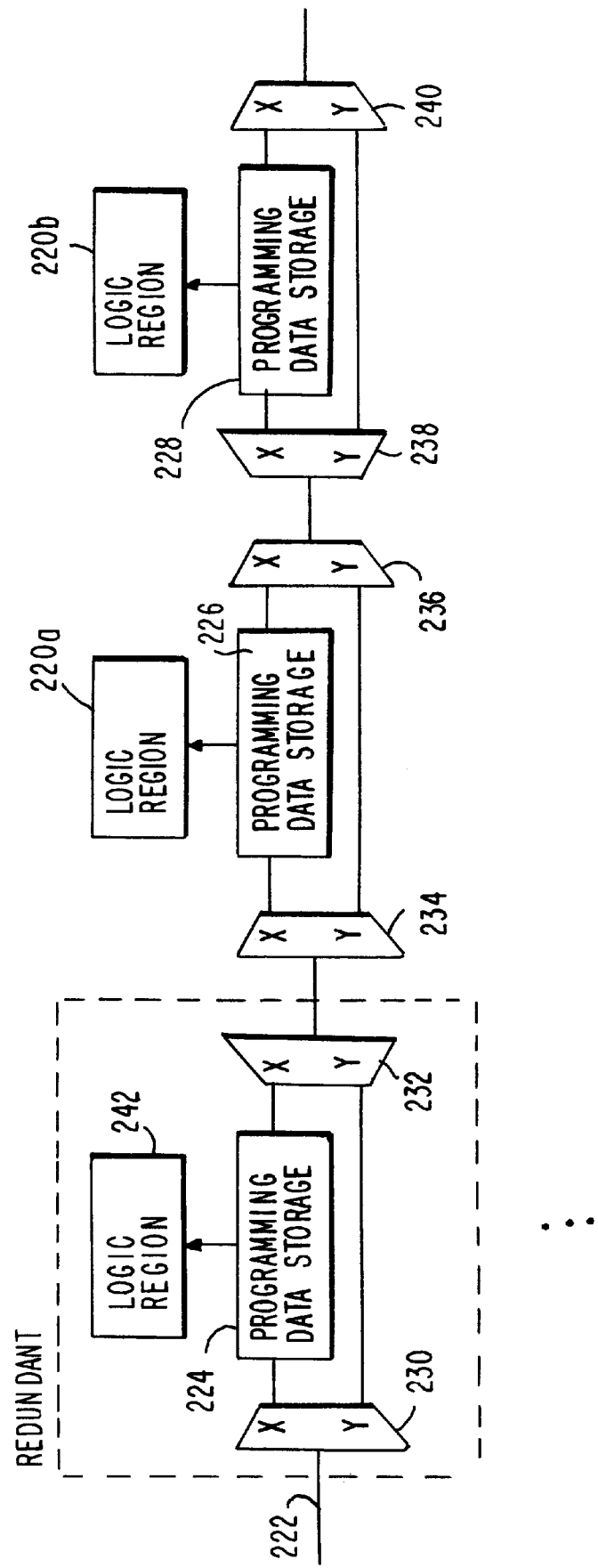
FIG. 9 is a schematic diagram of a portion of an illustrative programmable logic device in accordance with the present invention showing how multiplexers may be used to bypass a defective column when programming data is provided to the device.

Another approach for shifting programming data into the appropriate columns involves the arrangement shown in FIG. 9. In this arrangement, programming data for normal logic regions 220 that is supplied at input 222 is normally routed past redundant programming data storage 224 and into programming data storage 226 and 228 by configuring multiplexer 230 and demultiplexer 232 to pass signals through their y ports and by configuring multiplexers 234 and 238 and demultiplexers 236 and 240 to pass signals through their x ports. Programming data from programming data storage 226 and 228 is therefore applied to logic regions 220.

If a manufacturer detects a defect in, for example, logic region 220b, then multiplexers 230 and 234 and demultiplexers 232 and 236 are configured to pass data through their x ports and multiplexer 238 and demultiplexer 240 are configured to pass data through their y ports. As a result, the programming data that would normally be loaded into programming data storage 226 and 228 is loaded into programming data storage 224 (where it programs logic region 242) and programming data storage 226. The configuration of FIG. 9 therefore allows the programming data for the logic of the leftmost and center columns to be shifted into place for the programming data for the logic of the rightmost (defective) and center columns.

Figure 10:
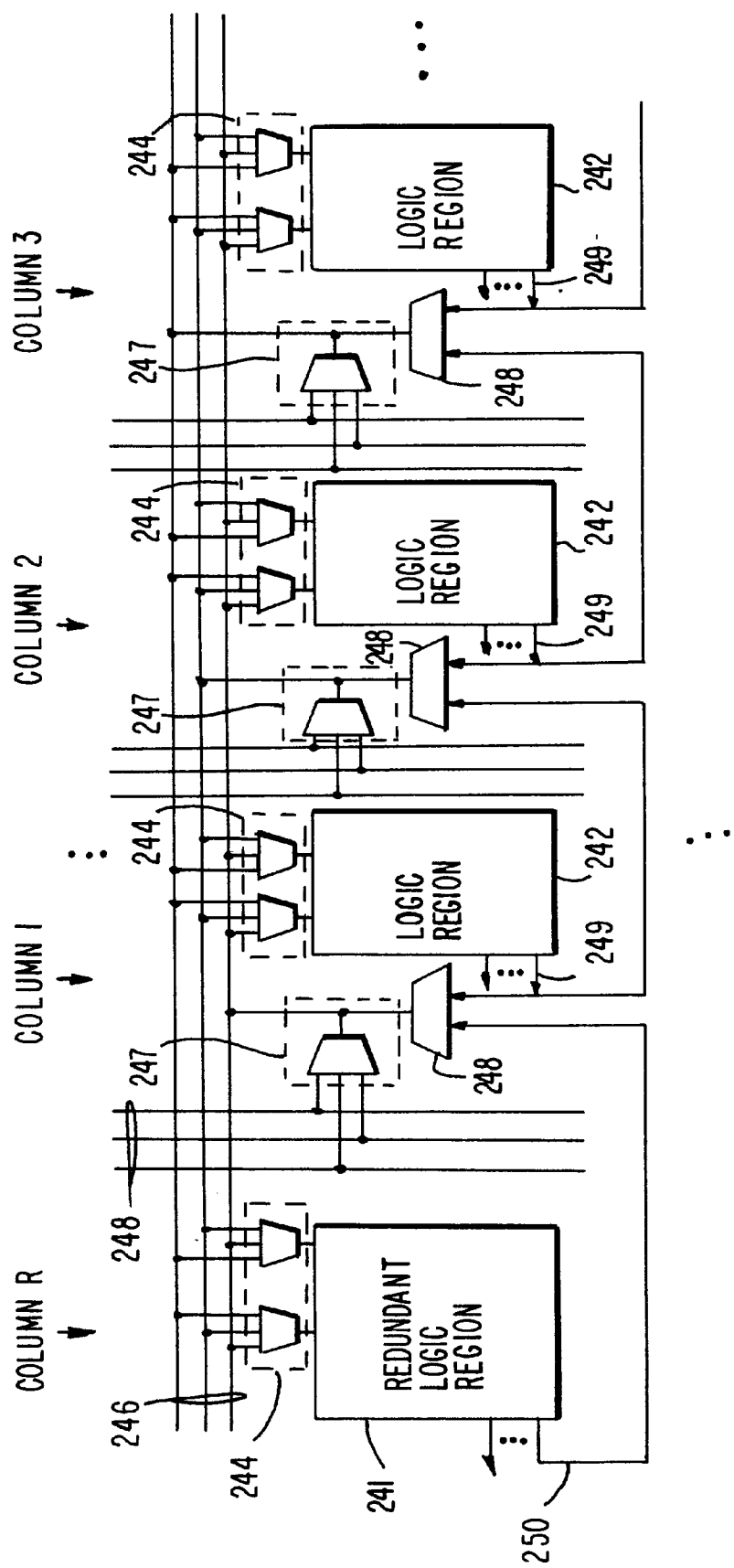
FIG. 10 is a schematic diagram of a portion of an illustrative programmable logic device in accordance with the present invention showing how the drivers associated with a given region of logic may be used even if logic regions are shifted to avoid using a defective region of logic.

FIG. 10 is a schematic diagram illustrating one way in which input/output connections may be reconfigured when columns of logic are shifted to repair a defective region of logic. In the arrangement of FIG. 10, redundant logic region 241 and normal logic regions 242 each have an associated set of input drivers 244 connected to interconnections 246. Each normal logic region 242 has an associated set of output drivers 247.

The connections made by input drivers 244 are the same for each of the logic regions 241 and 242. However, there are no output drivers 247 associated with redundant logic region 241, whereas there are output drivers 247 associated with each of the normal logic regions 242. During normal operation, the outputs 249 of each normal logic region 242 are applied to drivers 247 by the right-hand input line of each multiplexer 248. If a defect is detected in, for example, the logic of column 2, logic region 242 in column 1 is shifted to the right one column to replace the logic region in column 2 by connecting the outputs 249 of the logic region in column 1 to drivers 247 in column 2 through the left-hand input of multiplexer 248 in column 2. Similarly, multiplexer 248 in column 1 is configured to route output 250 of redundant logic region 241 to drivers 247 in column 1 in place of the outputs normally received from the logic region 242 in column 1.

If a logic super-region uses an arrangement such as shown in FIG. 10, programming data for logic regions 241 and 242 must be shifted when a defect is repaired. The programming data for input drivers 244 must also be shifted (e.g., into drivers 244 of column R rather than into drivers 244 of column 1, etc.) However, the programming data for drivers such as drivers 247 need not be shifted, because the outputs of the shifted logic regions are rerouted back to the same drivers 247 that were used during normal operation (when no defect was present).

With the shifting technique of FIG. 10, the programming data for the logic regions and for the input drivers is shifted, but the programming data for the output drivers is not shifted. Rather, multiplexers that are configured by the manufacturer are used to reroute the signals from the replacement logic regions to the original drivers. This approach is illustrated schematically in FIG. 11.

Figure 11:
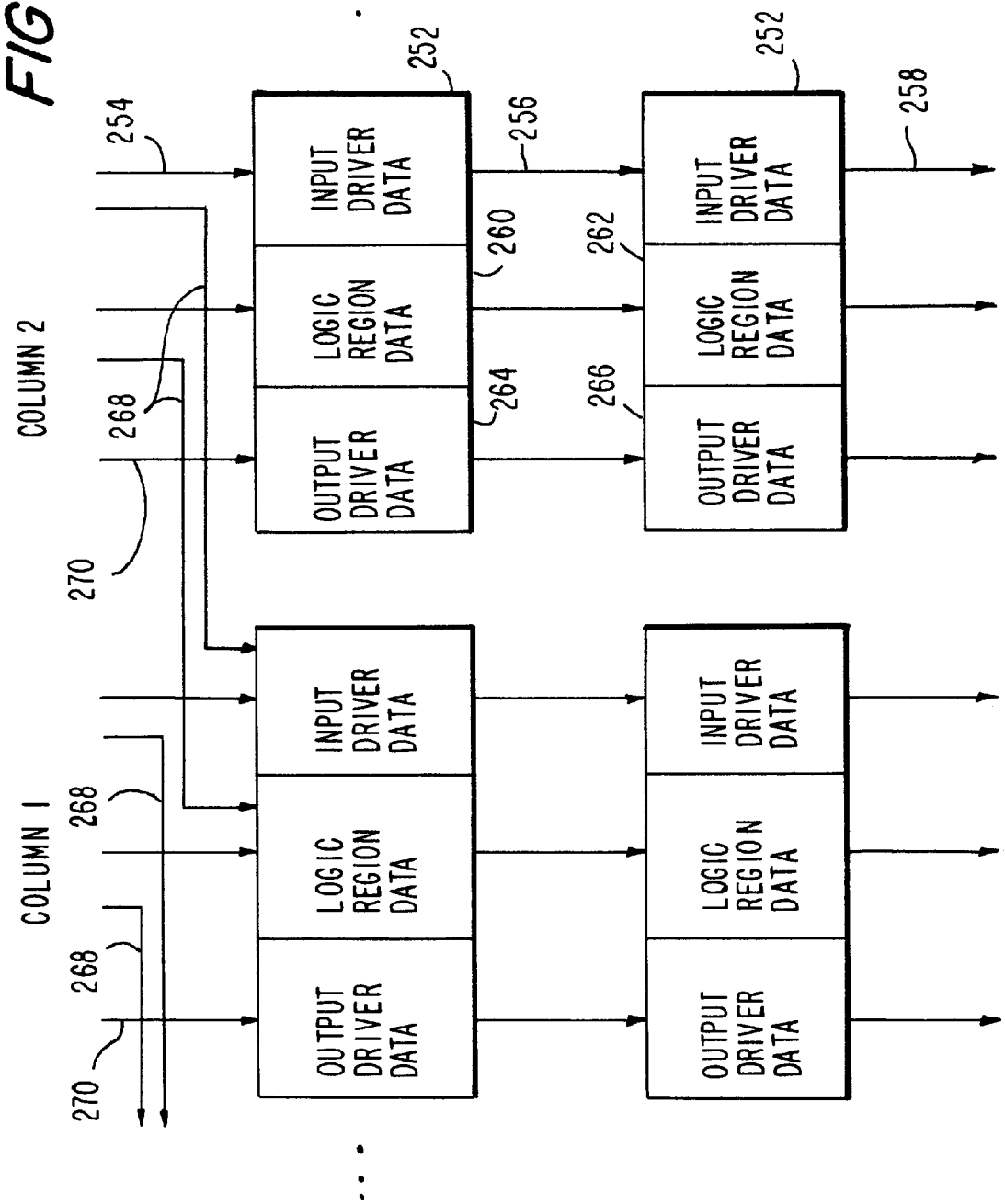
FIGS. 11 and 12 are schematic diagrams of illustrative programmable logic device arrangements in accordance with the present invention showing how logic region programming data may be shifted relative to device driver programming data.

As shown in FIG. 11, when no defects are present, programming data for the input drivers in column 2 is passed directly though each input driver data storage block 252 via paths 254, 256, and 258. Programming data for logic regions in column 2 is also passed directly through logic region data storage blocks 260 and 262. Programming data for the output drivers is passed directly through output driver data storage blocks 264 and 266. Column 1 is programmed in the same way.

When a defect is detected in, for example, column 2, programming data for the input drivers and logic regions is shifted to the left via paths 268, but programming data paths 270 for the output drivers are unchanged.

Figure 12:
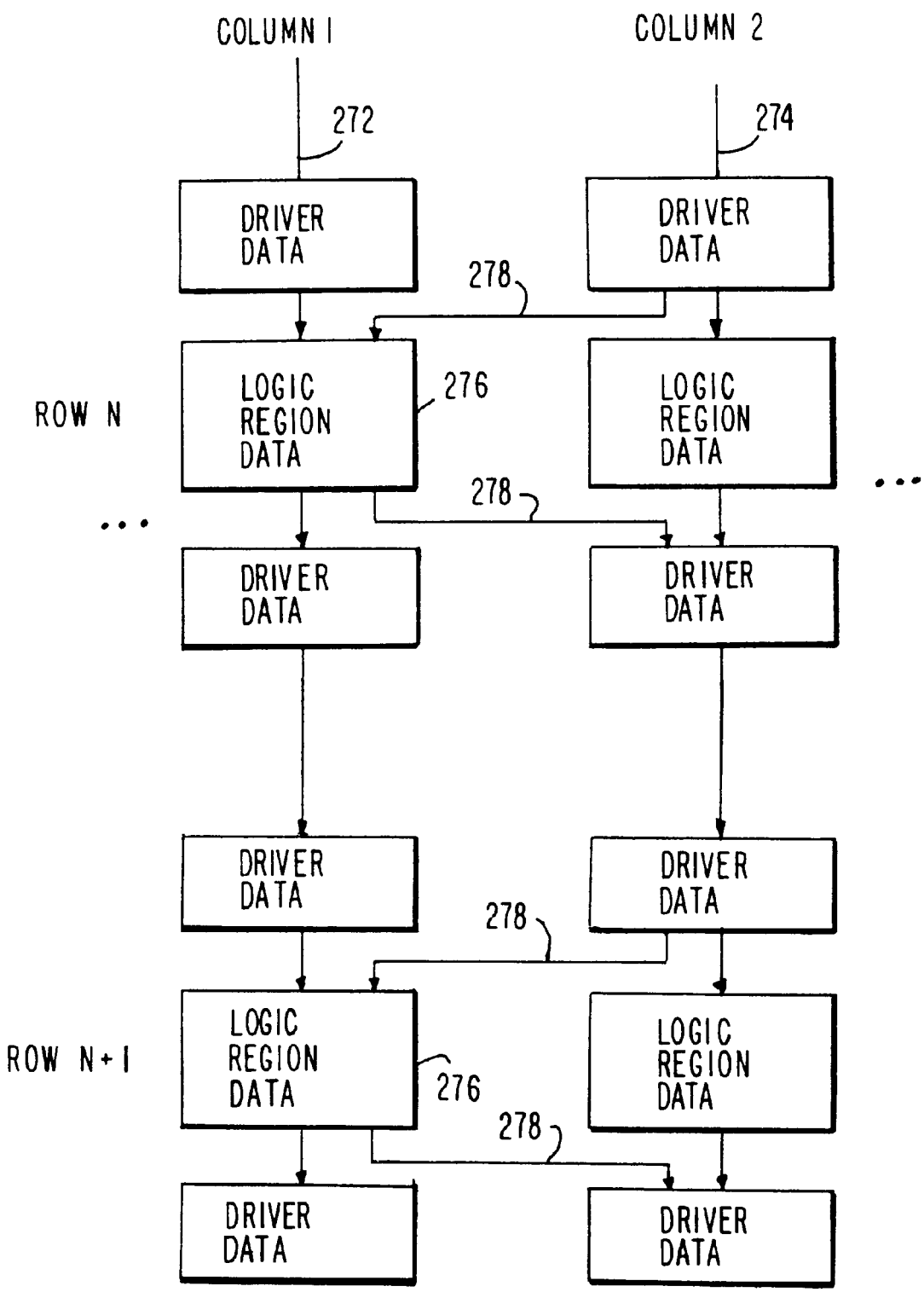

An alternative approach is shown in FIG. 12. In this arrangement, the logic super-region contains driver data storage blocks and logic region data storage blocks that are loaded serially via programming data inputs 272 and 274. Data for logic regions in column 2 can be shifted into the logic region data storage blocks 276 of column 1 via paths 278. The arrangement of FIG. 12 allows redundant circuitry to be shifted into place without reprogramming any driver connections.

The particular technique used to adjust the peripheral connections between the logic regions in a logic super-region and the exterior of the logic super-region depends on the type of shifting used for the logic regions. Techniques in which the original drivers are used during shifting generally require the fewest adjustments.

Any suitable combination of the shifting techniques shown in FIGS. 7–12 or any other suitable shifting techniques may be used to repair a defective logic super-region by shifting working logic circuitry into use in place of defective logic circuitry. Either row shifting or column shifting may be used. When a manufacturer determines that a given super-region has a defect and that given logic super-region has a redundant row or column of logic, the redundant row or column may be shifted into use.

Figure 13A:
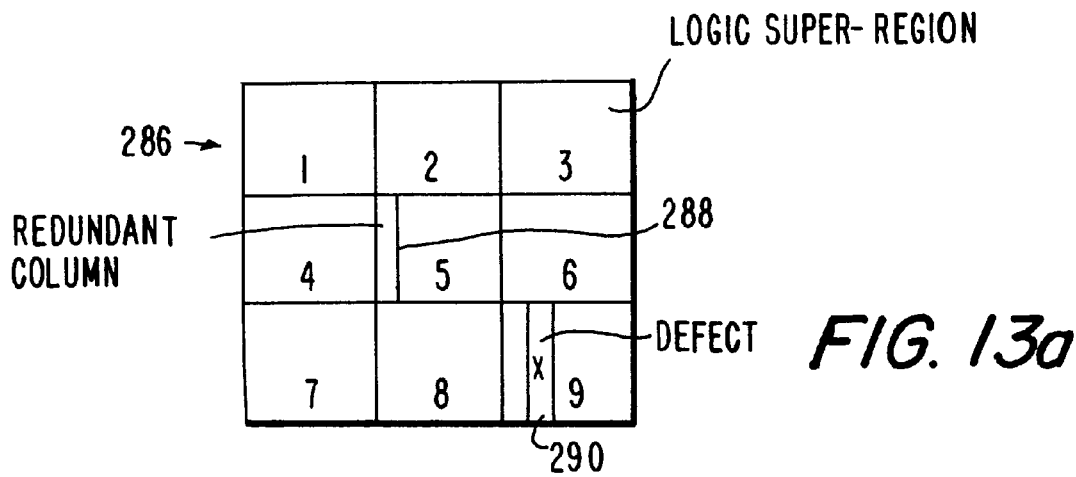
FIGS. 13a–c and 14a–c are schematic diagrams showing how logic area remapping in accordance with the redundancy scheme of the present invention may involve both swapping and shifting.

If desired, a redundancy scheme can be implemented in which only one logic super-region on a programmable logic device is provided with a redundant row or column. For example, in the arrangement shown in FIG. 13a, only the center logic super-region (No. 5) in programmable logic device 286 has a redundant column (i.e., redundant column 288). The redundant row or column is typically equivalent in hardware to the other rows or columns in the logic super-region, but is distinguishable in that it is unused on a defect-free device. When the logic hardware of the redundant row or column is used to repair a defective row or column, the programming data that normally ensures that the redundant row or column is inactive is redirected into the defective row or column, thereby ensuring that the defective row or column is inactive.

Figure 13B:
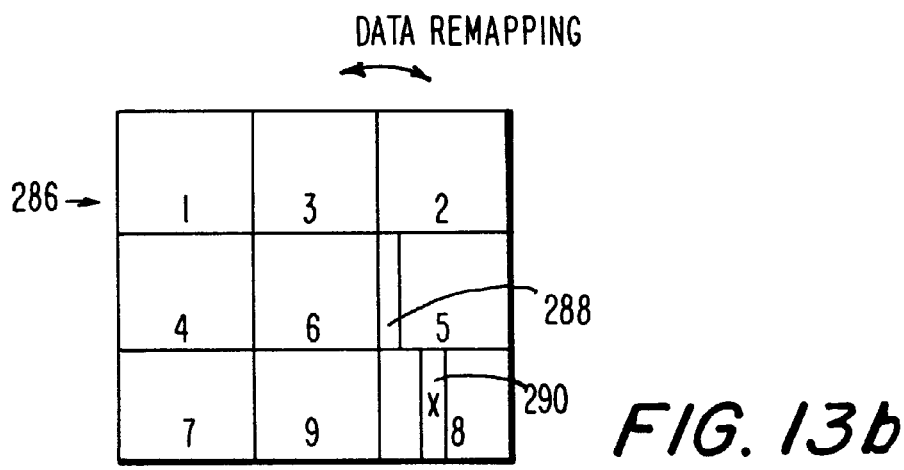
Figure 13C:
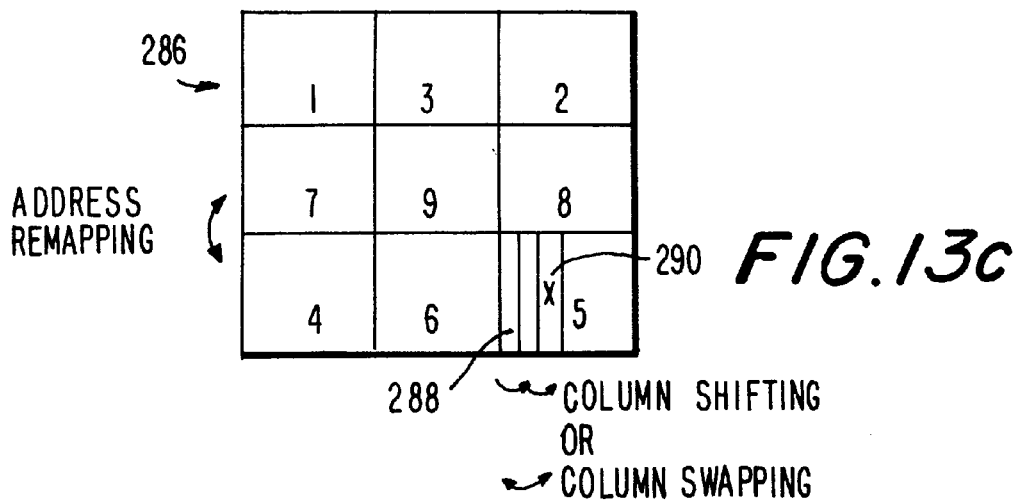

If a defect is detected in column 290 of logic super-region No. 9, data remapping may be used to swap the last two columns of logic super-regions in device 286, as shown in FIG. 13b. Address remapping may then be used to swap the last two rows of logic super-regions, as shown in FIG. 13c. Finally, column shifting may be used to replace defective column 290 with redundant column 288. As an alternative, a column swapping scheme such as the column swapping scheme of FIGS. 1–3 may be used to swap redundant column 288 and defective column 290 and thereby repair device 286.

Figure 14A:
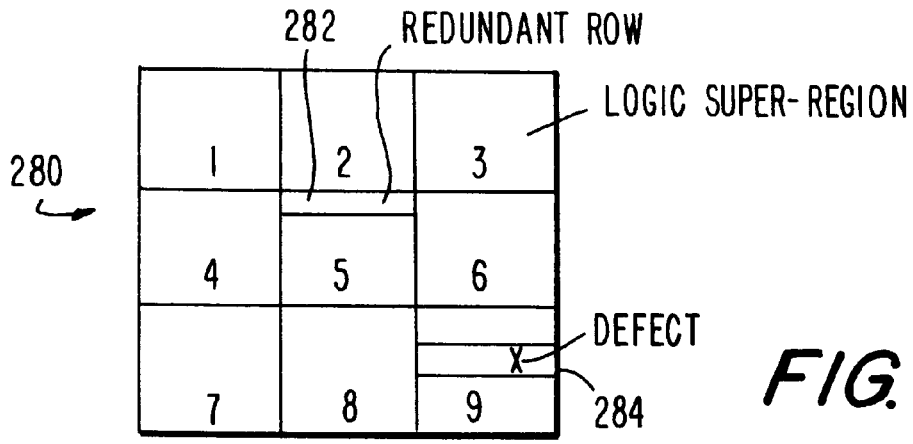
Figure 14B:
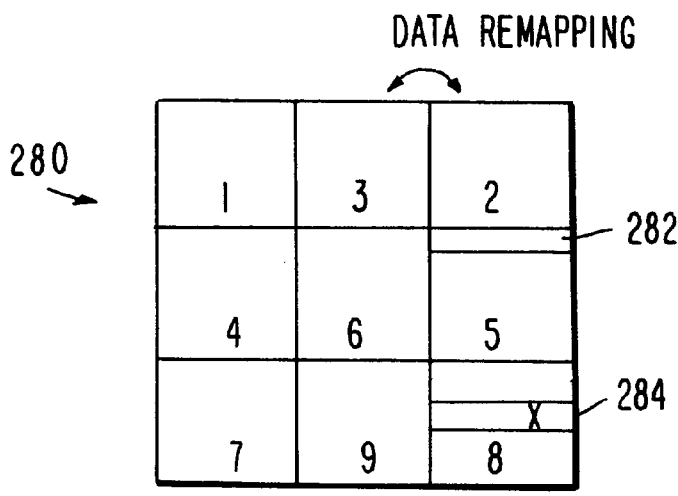
Figure 14C:
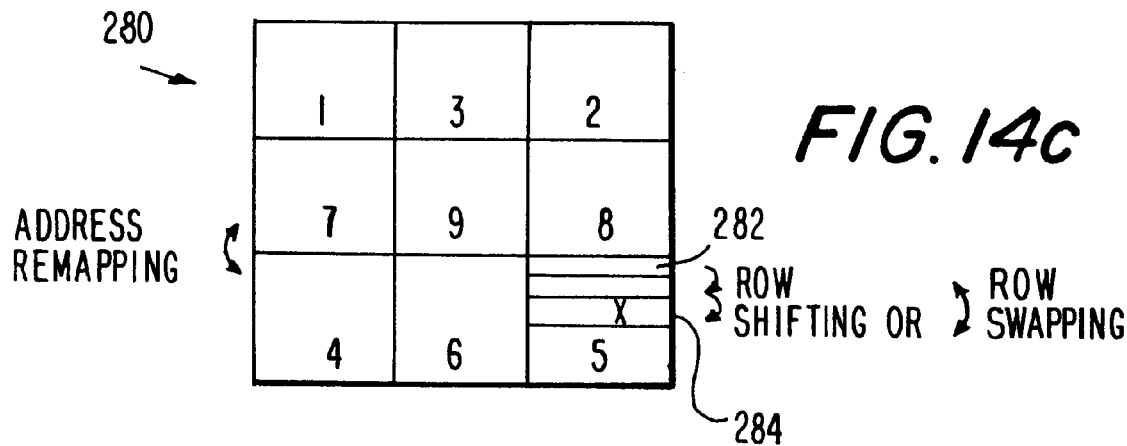

As shown in FIG. 14, the redundancy scheme of FIG. 13 may be implemented using a redundant row of logic regions rather than a redundant column of logic regions. In the arrangement shown in FIG. 14a, only the center logic super-region (No. 5) in programmable logic device 280 has a redundant row of logic regions (i.e., redundant row 282). If a defect is detected in row 284 in logic super-region No. 9, data remapping may be used to swap the last two columns of device 280, as shown in FIG. 14b. Address remapping may then be used to swap the last two rows of logic super-regions, as shown in FIG. 14c. Finally, row shifting may be used to replace defective row 284 with redundant row 282. As an alternative, a row swapping scheme such as the row swapping scheme of FIGS. 1–3 may be used to swap redundant row 282 and defective row 284 and thereby repair device 280.

The programmable logic regions in each logic super-region are typically connected to device-wide interconnections in the programmable logic device such as interconnections 166 and 170 in FIG. 5. In redundancy shifting arrangements in which programming data is shifted for both logic regions and their associated driver circuitry, routing circuitry such as routing circuitry 204 of FIG. 7 may be used to connect the appropriate logic regions 192 and 194 to the device-wide interconnections.

Figure 15:
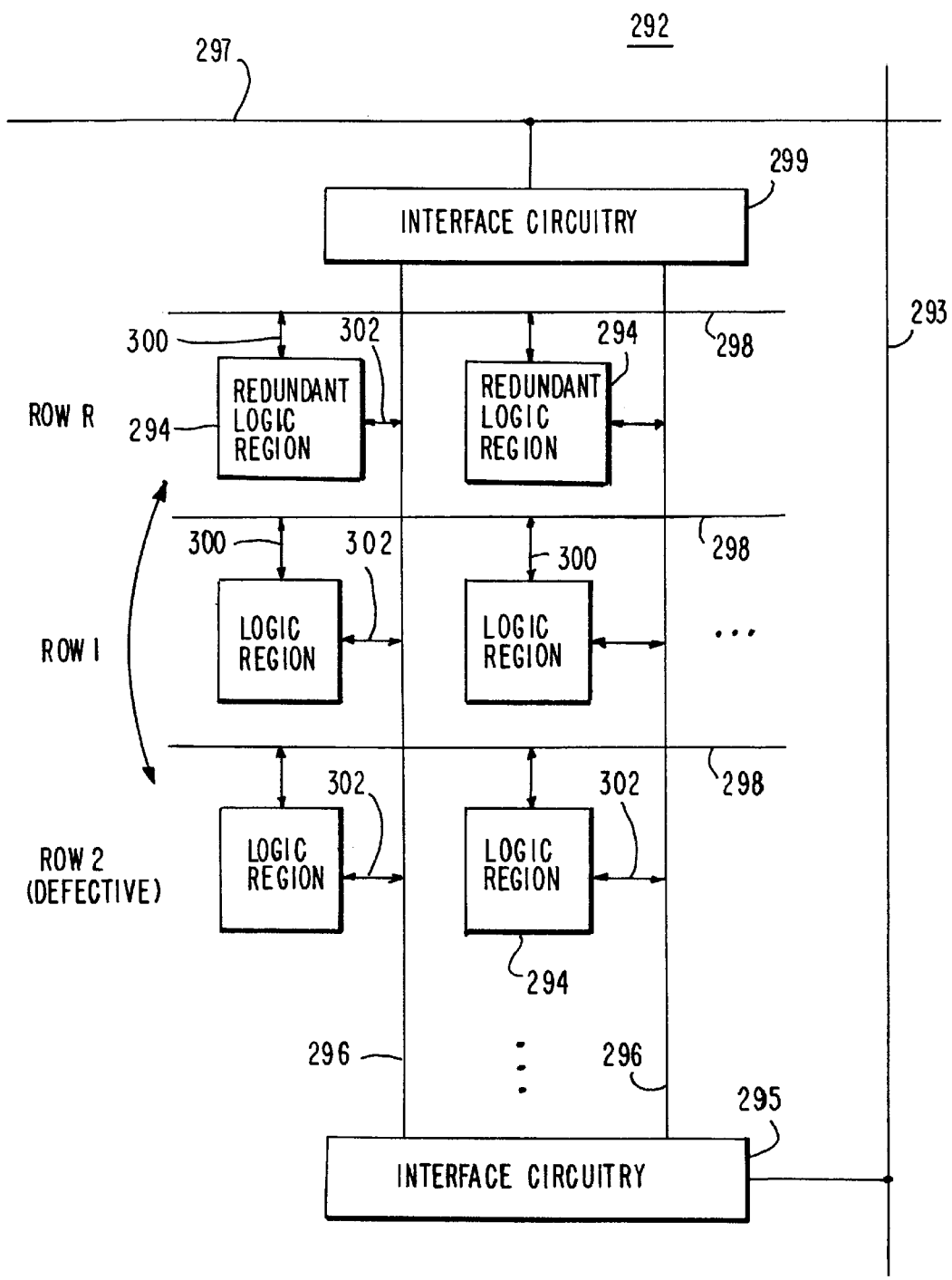
FIG. 15 is a schematic diagram showing how the interface circuitry associated with a logic super-region is not disturbed by row swapping when the connections between each logic region in a column of the logic super-region and the vertical conductors in that column are identical in accordance with the present invention.

Another way in which to interconnect the logic regions and the device-wide interconnections is shown in FIG. 15. In logic super-region 292 of FIG. 15, rows and columns of logic regions 294 are interconnected with device-wide vertical interconnections 293 (similar to vertical interconnections 170 of FIG. 5) by interface circuitry 295 and are interconnected with device-wide horizontal interconnections 297 by interface circuitry 299.

The top row of logic regions 294 is a redundant row that may be shifted or swapped into place when a defect is detected in another row. Each column of logic regions 294 has an associated set of vertical interconnections 296 and each row of logic regions 294 has an associated set of horizontal interconnections 298. Logic regions 294 are connected to horizontal interconnections 298 with connectors 300. Although the connectors 300 for different logic regions in a given column preferably have the same pattern, the connectors 300 for different logic regions in a given row may have different patterns.

Connectors 302 are used to connect logic regions 294 to vertical interconnections 296. All connectors 302 in a column have the same pattern. As a result, the connections made between the logic regions 294 and interconnections 296 in the unswapped configuration of logic super-region 292 are identical to the connections made between the logic regions 294 and interconnections 296 in a swapped configuration (e.g., when redundant row R is swapped with a row such as row 2 or when row R is shifted into position in place of row 1 and row 1 is shifted into position in place of row 2). A similar arrangement may be used when redundant columns of logic regions are provided, rather than redundant rows.

With the arrangement shown in FIG. 15, the connections between logic regions 294 and device-wide interconnections 293 and 297 are not affected by the shifting or swapping of rows or columns of logic regions. As a result, it is not necessary to use routing circuitry such as routing circuitry 204 of FIG. 7 or routing circuitry 50 and 58 of FIG. 2 to redirect signals back to their original paths when rows or columns of logic regions are swapped or shifted.

Figure 16A:
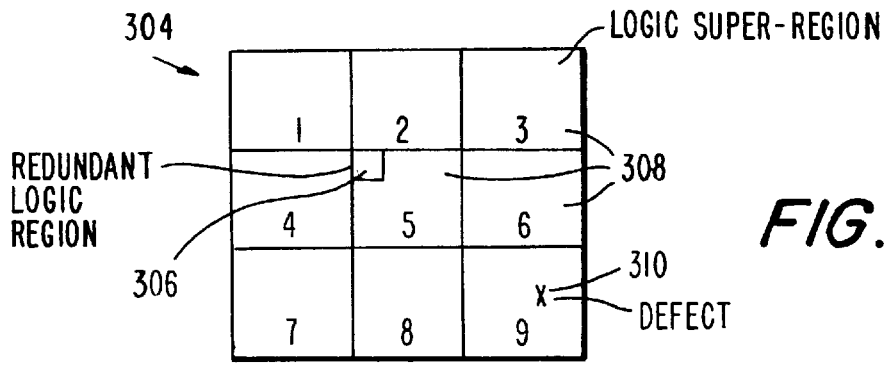
FIGS. 16a–d are schematic diagrams showing how a programmable logic device containing rows and columns of logic-super regions each of which contains rows and columns of logic regions may be repaired using a single redundant logic region in accordance with the present invention.
Figure 16B:
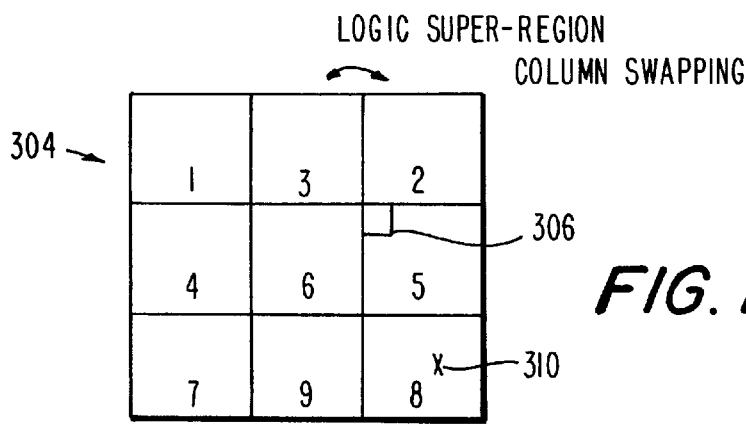
Figure 16C:
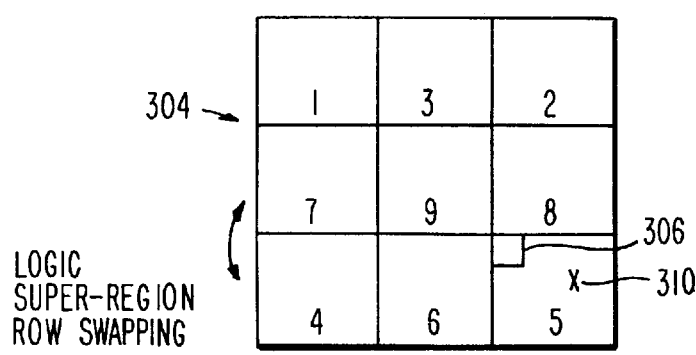

If desired, redundancy for a programmable logic device based on an array of logic super-regions may be implemented using a single redundant logic region. As shown in FIG. 16a, with this type of redundancy scheme programmable logic device 304 has a redundant logic region 306 in, for example, center logic super-region 308 (No. 5). Redundant logic region 306 is preferably equivalent in hardware to the other logic regions in the logic super-region, but is distinguishable in that it is unused on a defect-free device. If a defect 310 is detected in logic super-region No. 9, logic super-region column swapping may be used to logically remap device 304 as shown in FIG. 16b. Logic super-region row swapping may then be used to remap device 304 as shown in FIG. 16c. When the logic hardware of the redundant logic region is used to repair a defective logic region, the programming data that normally ensures that the redundant logic region is inactive is redirected into the defective logic region, thereby ensuring that the defective logic region is inactive.

Figure 16D:
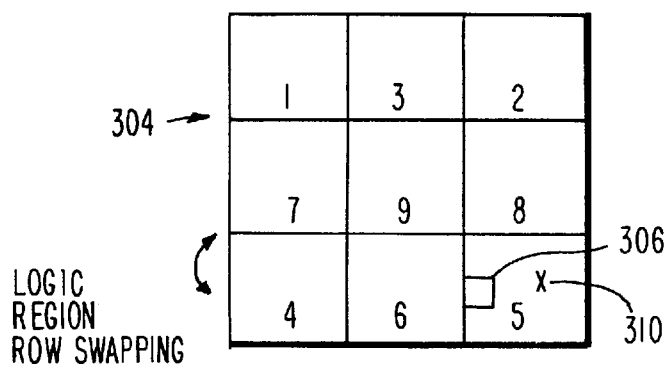

As shown in FIG. 16d, logic region row swapping may be used to remap redundant logic region 306 so that it coincides with the same row as defect 310. Either logic region column shifting or logic region column swapping may be used to replace defective logic region 310 with redundant logic region 306.

An alternative to the approach shown in FIGS. 16c and 16d is to use logic region column swapping to remap redundant logic region 306 so that it coincides with the same column as defect 310 and to use either logic region row shifting or logic region row swapping to replace defective logic region 310 with redundant logic region 306.

If desired, logic super-regions such as logic super-regions 164 of FIG. 4 may contain a "folded row" of logic regions, rather than the array of logic regions 174 shown in FIG. 5. An illustrative logic super-region 312 based on logic regions 314 in a folded row arrangement is shown in FIG. 17. Logic super-region 312 is said to have a folded row configuration because logic super-region 312 has only a single logical row of logic regions 174 connected to a single row of horizontal interconnections 318. Because logic regions 174 are physically divided into upper and lower half-rows, redundancy can be implemented using a redundant half-row of logic regions 174.

In the arrangement of FIG. 17, logic regions 314 in upper half-row 316 drive horizontal interconnections 318 in the same pattern that logic regions 314 in lower half-row 320 drive horizontal interconnections 318. Multiplexers 326 and 328 connect horizontal interconnections 318 to device-wide interconnections (not shown in FIG. 17) via inputs 325 and outputs 327. Multiplexers 326 and 328 may be configured during programming of logic super-region 312.

There are typically numerous input lines 322 and output lines 324 associated with each logic region 314. Each input line 322 that provides signals from a given horizontal interconnection 318 to a logic region 314 in lower half-row 320 has a corresponding input line 322 that provides signals from the same horizontal interconnection 318 to a corresponding logic region 314 in upper half-row 316. Similarly, each output line 324 that provides signals to a given horizontal interconnection 318 from a logic region 314 in lower half-row 320 has a corresponding output line 324 that provides signals to the same horizontal interconnection 318 from a corresponding logic region 314 in upper half-row 316.

The symmetric pattern of logic region input/output connections used in logic super-region 312 of FIG. 17 allows either upper half-row 316 or lower half-row 320 to be used as a redundant half-row without affecting which horizontal interconnections 318 are used to connect logic regions 314 to the device-wide interconnections via multiplexers 326 and 328. The arrangement of FIG. 17 therefore allows the redundant half-row to be used to replace a defective half-row without using additional routing circuitry.

A single folded row logic super-region 312 (e.g., the center logic super-region) containing a redundant half-row may be used to provide redundancy for a programmable logic device containing an array of folded row logic super-regions 312. The upper and lower half-rows of such logic super-regions may be logically remapped using any suitable logic region row shifting or logic region row swapping technique. This allows a defective lower half-row to be replaced by a redundant upper half-row. If the defective lower half-row is not initially located in the same logic super-region as the redundant upper half-row, logic super-region row and column swapping may be used to remap the device accordingly.

Figure 18:
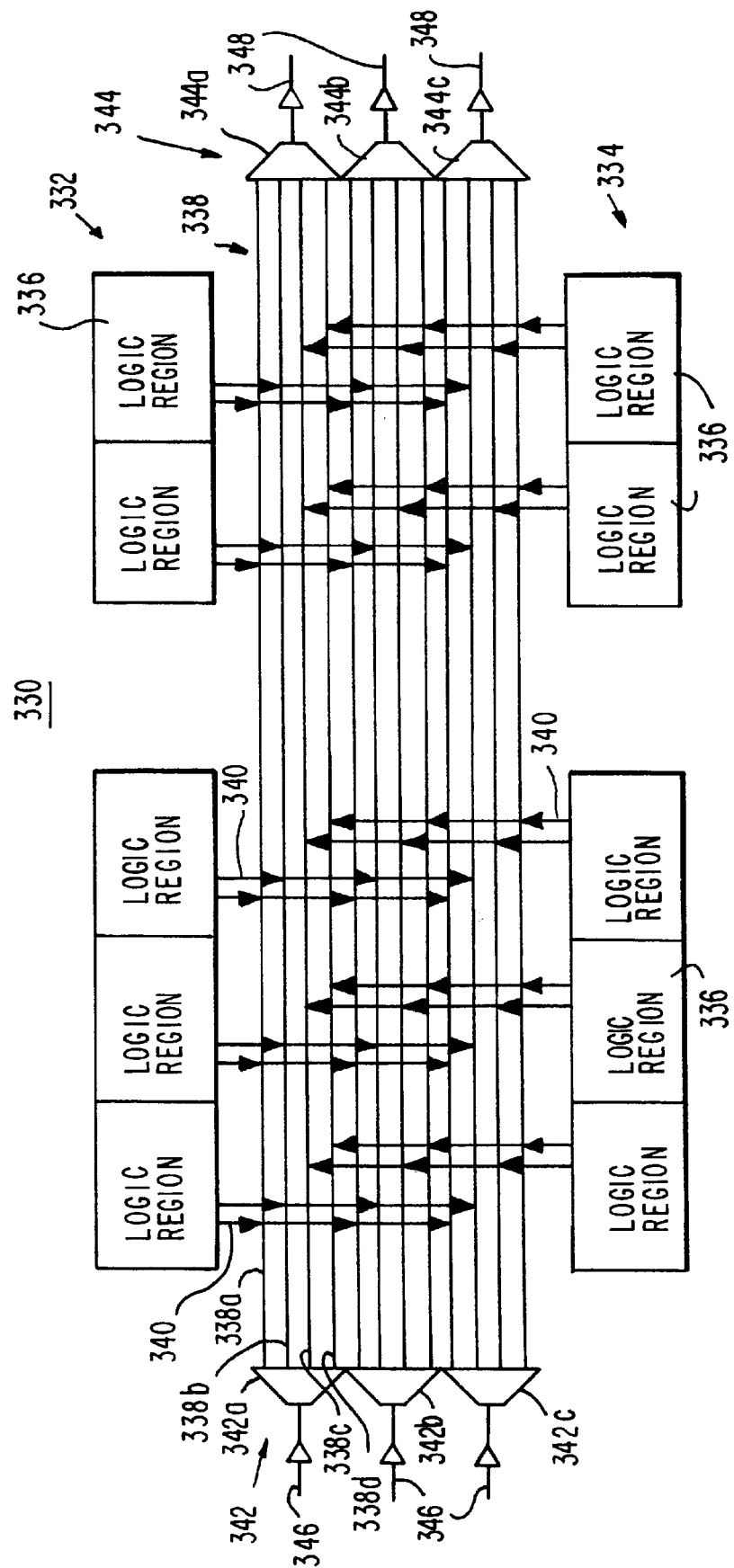

Another folded row logic super-region arrangement is shown in FIG. 18. In logic super-region 330 of FIG. 18, upper and lower half-rows 332 and 334 of logic regions 336 are connected to horizontal interconnections 338 using slightly different patterns of output lines 340. The input lines to logic regions 336, which are not shown separately in FIG. 18 to avoid over-complicating the drawing, are arranged symmetrically for the upper and lower half-rows 332 and 334 using an input line pattern such as the one shown in FIG. 17.

Logic regions 336 in upper half-row 332 drive horizontal interconnections such as interconnections 338a and 338b, which are connected to the upper half of multiplexers 342a and 344a. Logic regions 336 in lower half-row 334 drive horizontal interconnections such as interconnections 338c and 338d, which are connected to the lower half of multiplexers 342a and 344a. Similar symmetrical patterns of connections are made between logic regions 336 and multiplexers 342b and 344b and multiplexers 342c and 344c. When it is desired to shift or swap upper half-row 332 to replace lower half-row 334, multiplexers 342 and 344 are directed to either use the upper sets of horizontal interconnections such as interconnections 338a and 338b or the lower sets of interconnections such as interconnections 338c and 338d, thereby selecting which of the two half-rows of logic regions 336 are connected to the device-wide interconnections (not shown in FIG. 18) via inputs 346 and outputs 348.

Multiplexers 342 and 344 are typically configured during programming of logic super-region 330, but may also be controlled by redundancy configuration data received from redundancy configuration data storage 66 (FIG. 1). Any suitable type of shifting or swapping scheme may be used to replace a defective lower half-row 332 with an upper-half row. If the defective lower half-row is not initially located in the same logic super-region as the redundant upper half-row, then logic super-region row and column swapping may be used to remap the device accordingly.

If desired, the redundancy schemes of the present invention may be used in quadrants or other subsections of a programmable logic device by providing a redundant logic super-region or partially redundant logic super-region in each subsection of the device.

The foregoing is merely illustrative of the principles of this invention and various modifications can be made by those skilled in the art without departing from the scope and spirit of the invention.

What is claimed is:

1. A method for repairing a logic circuit that has a redundant programmable logic area and a plurality of normal programmable logic areas when it is determined that one of the normal programmable logic areas that is not immediately adjacent to the redundant programmable logic area is defective, the method comprising:

supplying programming data to the logic circuit to program the logic circuit; and swapping the defective programmable logic area that is not immediately adjacent to the redundant programmable logic area with the redundant programmable logic area by routing the programming data to the programmable logic areas so that the programming data for the programmable logic area containing the defect that is not immediately adjacent to the redundant programmable logic area is routed to the redundant programmable logic area.

2. The method defined in claim 1 wherein the programmable logic areas are arranged in columns, the method further comprising swapping the defective programmable logic area and the redundant programmable logic area by routing the programming data to the columns of programmable logic areas using data path remapping circuitry.

3. The method defined in claim 1 wherein the logic areas are arranged in a plurality of rows, the method further comprising addressing the rows of logic areas using address line remapping circuitry.

4. The method defined in claim 1 wherein the logic areas are arranged in a plurality of rows, the method further comprising swapping two non-adjacent rows of logic areas.

5. The method defined in claim 1 further comprising storing the programming data in programming data storage circuits associated with the logic areas.

6. The method defined in claim 1 wherein the logic areas are arranged in rows and columns, the method further comprising swapping two given rows of the logic areas with remapping circuitry.

7. The method defined in claim 1 wherein the logic areas are logic super-regions arranged in columns, the method further comprising swapping two given non-adjacent columns of the logic super-regions with remapping circuitry.

8. The method defined in claim 1 wherein the logic areas are logic super-regions arranged in rows and columns, the method further comprising swapping two given columns of the logic super-regions with remapping circuitry.

9. The method defined in claim 1 wherein the logic areas are logic regions arranged in rows and columns, the method further comprising swapping two given rows of the logic regions with remapping circuitry.

10. The method defined in claim 1 wherein the logic areas are logic regions arranged in rows and columns, the method further comprising swapping two given columns of the logic regions with remapping circuitry.

11. The method defined in claim 1 wherein the logic areas are arranged in rows and columns having associated input/output connections, the method further comprising:

swapping two given non-adjacent rows of the logic areas with remapping circuitry during programming of the circuit; and redirecting signals for the swapped non-adjacent rows during operation of the circuit with input/output routing circuitry so that the input/output connections to which the signals are provided are unaffected by swapping the rows.

12. The method defined in claim 1 wherein the logic areas are arranged in rows and columns having associated input/output connections, the method further comprising:

swapping two given non-adjacent columns of the logic areas with remapping circuitry during programming of the circuit; and redirecting signals for the swapped non-adjacent columns during operation of the circuit with input/output routing circuitry so that the input/output connections to which the signals are provided are unaffected by swapping the columns.

13. The method defined in claim 1 further comprising:

receiving the programming data with a plurality of data registers;

providing the programming data to the logic areas with the data registers; and enabling the data registers with programming data dynamic routing control circuitry in an order determined by redundancy configuration data.

14. The method defined in claim 1 further comprising:

storing the programming data in programming data storage circuits associated with the logic areas; and addressing the programming data storage circuits in each logic area in an order determined by redundancy configuration data.

15. The method defined in claim 1 wherein the logic areas are arranged in rows and columns having associated input/output connections, the method further comprising:

providing the signals in each row and column to the input/output connections with input/output circuitry associated with each row and column; and swapping the input/output circuitry associated with two given non-adjacent rows of the logic areas during programming of the circuit.

16. The method defined in claim 1 wherein the logic areas are arranged in rows and columns having associated input/output connections, the method further comprising:

providing the signals in each row and column to the input/output connections with input/output circuitry associated with each row and column; and swapping the input/output circuitry associated with two given columns of the logic areas during programming of the circuit.

17. The method defined in claim 1 wherein the logic areas are logic super-regions arranged in rows and columns, the method further comprising swapping two given non-adjacent columns of the logic super-regions by data remapping.

18. The method defined in claim 1 wherein the logic areas are logic super-regions arranged in rows and columns, the method further comprising the step of swapping two given non-adjacent rows of the logic super-regions by address remapping.

* * * * *